(12) United States Patent
Ha et al.

(10) Patent No.: US 11,323,554 B2
(45) Date of Patent: May 3, 2022

(54) ELECTRONIC DEVICE INCLUDING GUIDE MEMBER FOR FACILITATING ASSEMBLING OR SEPARATION OF ELECTRONIC COMPONENT

(71) Applicant: Samsung Electronics Co., Ltd., Suwon-si (KR)

(72) Inventors: Seon-Woo Ha, Suwon-si (KR); Sang-Kyu Lee, Hwaseong-si (KR); Jung-Hoon Lee, Suwon-si (KR); Tae-Hyun Sung, Suwon-si (KR); Byoung-Uk Yoon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/493,250

(22) PCT Filed: Dec. 27, 2017

(86) PCT No.: PCT/KR2017/015541
§ 371 (c)(1),
(2) Date: Sep. 11, 2019

(87) PCT Pub. No.: WO2018/169175
PCT Pub. Date: Sep. 20, 2018

(65) Prior Publication Data
US 2020/0120193 A1    Apr. 16, 2020

(30) Foreign Application Priority Data

Mar. 15, 2017 (KR) .................. 10-2017-0032638

(51) Int. Cl.
*H04M 1/02* (2006.01)
*H05K 9/00* (2006.01)
(Continued)

(52) U.S. Cl.
CPC ....... *H04M 1/0249* (2013.01); *H04M 1/0264* (2013.01); *H04M 1/0266* (2013.01);
(Continued)

(58) Field of Classification Search
CPC .................. H05K 9/0081; H04M 1/0249; H04M 1/0264; H04N 5/2254
See application file for complete search history.

(56) References Cited

U.S. PATENT DOCUMENTS 7,986,522 B2 * 7/2011 Zaitsu ................. H04M 1/0218
361/679.55
8,054,566 B2 * 11/2011 Heim ..................... H02N 1/002
359/823

(Continued)

FOREIGN PATENT DOCUMENTS

JP      2004-180223 A     6/2004
KR  10-2005-0013444 A     2/2005
(Continued)

OTHER PUBLICATIONS

ISA/KR, International Search Report and Written Opinion of the International Searching Authority, International Application No. PCT/KR2017/015541, dated Apr. 5, 2018, 11 pages.

*Primary Examiner* — Rockshana D Chowdhury
*Assistant Examiner* — Douglas R Burtner

(57) ABSTRACT

According to various embodiments of the present invention, an electronic device may comprise: a housing which comprises a first surface facing in a first direction, a second surface facing in a second direction opposite to the first direction, and a side wall at least partially surrounding a space between the first surface and the second surface; at least one seating part formed to be partially surrounded by a part of the side wall inside the housing; a guide member disposed adjacent to a part of the side wall inside the housing and surrounding another part of the seating part; and at least (Continued)

one electronic component comprising a body part and a protrusion part formed on one surface of the body part, wherein the electronic component may be guided by the guide member to enter the seating part along a direction inclined with respect to the side wall or the first surface and then to be mounted in the seating part. The electronic device as described above may vary depending on embodiments.

15 Claims, 18 Drawing Sheets

(51) Int. Cl.
  *H04N 5/225* (2006.01)
  *G06F 3/041* (2006.01)

(52) U.S. Cl.
  CPC ......... *H04N 5/2254* (2013.01); *H05K 9/0081* (2013.01); *G06F 3/0412* (2013.01)

(56) References Cited

U.S. PATENT DOCUMENTS

| | | | | |
|---|---|---|---|---|
| 9,462,165 | B2* | 10/2016 | Moon | H04N 5/2253 |
| 9,608,358 | B2* | 3/2017 | Yoon | H01R 24/58 |
| 9,639,123 | B2* | 5/2017 | Choi | G06F 1/182 |
| 9,857,555 | B2* | 1/2018 | Lee | G02B 7/09 |
| 10,530,912 | B2* | 1/2020 | Moon | H04M 1/185 |
| 10,935,751 | B2* | 3/2021 | Shin | H04N 5/232 |
| 10,962,733 | B2* | 3/2021 | Kim | G02B 7/02 |
| 10,969,659 | B2* | 4/2021 | Park | H04N 5/2258 |
| RE48,667 | E* | 8/2021 | Park | G03B 3/10 |
| 11,215,789 | B2* | 1/2022 | Park | G03B 3/10 |
| 2004/0157652 | A1 | 8/2004 | Yamazaki | |
| 2008/0106811 | A1* | 5/2008 | Eromaki | G02B 7/102 |
| | | | | 359/817 |
| 2009/0284844 | A1* | 11/2009 | Koc | G01D 5/34753 |
| | | | | 359/694 |
| 2010/0122452 | A1* | 5/2010 | Ho | H04N 5/2252 |
| | | | | 29/729 |
| 2012/0075519 | A1* | 3/2012 | Blasch | G03B 3/10 |
| | | | | 348/340 |
| 2012/0273244 | A1* | 11/2012 | Takita | H05K 5/069 |
| | | | | 174/50 |
| 2014/0063821 | A1* | 3/2014 | Hegde | H05K 3/323 |
| | | | | 362/382 |
| 2014/0253799 | A1* | 9/2014 | Moon | H04N 5/2253 |
| | | | | 348/376 |
| 2015/0005031 | A1* | 1/2015 | Sheu | H04N 5/2259 |
| | | | | 455/556.1 |
| 2015/0293430 | A1* | 10/2015 | O'Neill | G03B 17/566 |
| | | | | 396/544 |
| 2016/0284490 | A1 | 9/2016 | Kim et al. | |
| 2017/0146773 | A1* | 5/2017 | Park | H04M 1/0264 |
| 2017/0171371 | A1* | 6/2017 | Jannard | H04N 5/2254 |
| 2017/0195537 | A1* | 7/2017 | Chang | H04M 1/0277 |
| 2017/0351164 | A1* | 12/2017 | Kim | H04N 5/2254 |
| 2018/0176351 | A1* | 6/2018 | Wei | H04M 1/0264 |
| 2019/0104239 | A1* | 4/2019 | Aschwanden | H04N 5/23299 |
| 2020/0103673 | A1* | 4/2020 | Lee | H04N 5/2254 |
| 2020/0150377 | A1* | 5/2020 | Han | G02B 7/025 |
| 2021/0173126 | A1* | 6/2021 | Lee | H04M 1/0277 |
| 2021/0294067 | A1* | 9/2021 | Park | G02B 7/09 |

FOREIGN PATENT DOCUMENTS

| | | |
|---|---|---|
| KR | 10-2013-0081882 A | 7/2013 |
| KR | 10-2014-0111503 A | 9/2014 |
| KR | 10-2015-0144134 A | 12/2015 |
| KR | 10-2016-0114325 A | 10/2016 |

* cited by examiner

ELECTRONIC DEVICE INCLUDING GUIDE MEMBER FOR FACILITATING ASSEMBLING OR SEPARATION OF ELECTRONIC COMPONENT

CROSS-REFERENCE TO RELATED APPLICATIONS

This application is a U.S. National Stage application under 35 U.S.C. § 371 of an International application filed on Dec. 27, 2017 and assigned application number PCT/KR2017/015541, which claimed the priority of a Korean patent application filed on Mar. 15, 2017 in the Korean intellectual Property Office and assigned Serial number 10-2017-0032638, the entire disclosure of which is hereby incorporated by reference.

BACKGROUND

1. Field

The disclosure relates to an electronic device, and for example, relates to an electronic device including an electronic component.

2. Description of Related Art

Electronic components capable of coping with various functions while being small-sized and lightweight for securing portability have been mounted on electronic devices. For example, while electronic components such as microphones, speaker phones, camera modules, and display devices for inputting and outputting sounds, videos, and images have been commonly mounted on electronic devices, recently, fingerprint sensors (fingerprint recognition sensors) and iris sensors (iris recognition sensors) for securing security functions and lighting devices that allow excellent image photographing in an environment of a low intensity of illumination have been mounted. Further, in the acoustic field, a plurality of microphones, a plurality of speaker phones, and the like may be mounted on electronic devices to input and output sounds of high quality.

As various electronic components are mounted on small-sized and lightweight electronic devices, the inner spaces of the electronic devices become narrower, but a larger number of electronic components may still be disposed. In an operation of assembling the electronic components, an avoidance space for avoiding interference with the inner structure may be separately provided in the interior of the electronic device.

For example, even though the camera module is miniaturized, an image of an excellent quality can be secured by mounting an automatic focusing and zoon-in/zoon-out function and a lens barrel that proceeds and retreats in the direction of an optical axis may be provided in realizing an automatic focusing function. If the lens barrel protrudes from the body part of the camera module, an avoidance space may be provided in the interior of the electronic device to prevent interferences with the internal structures of the electronic device.

SUMMARY

The avoidance space may mean 'a space for allowing the lens barrel to move without interference with another structure in an operation of assembling or separating an electronic component (e.g., a camera module)'. As the number of electronic components mounted on the electronic device becomes larger, the number of the avoidance spaces becomes larger. However, because the avoidance space substantially cannot be utilized after the electronic components are assembled, the inner space utilization efficiency of the electronic device may be lowered. When a plurality of electronic components is disposed while being exposed through the avoidance spaces, the electronic components may be damaged due to physical contacts in the assembling or separation process, and electromagnetic interference may be caused in the operations of the electronic components. In some embodiments, the avoidance space increases the thickness of the structure (e.g., the internal structure of the housing) of the electronic device and has a form of a through-hole, lowering the strength of the electronic device.

Various embodiments of the disclosure may provide an electronic device which facilitates assembling or separation of an electronic component while preventing interference with an internal structure during assembling of the electronic component and has an improved strength by reducing an avoidance space.

According to various embodiments of the disclosure, an electronic device may include:

a housing including a first surface facing a first direction, a second surface facing a second direction that is opposite to the first direction, and a side wall at least partially surrounding a space between the first surface and the second surface, at least one seating part disposed such that at least a portion thereof is surrounded by a portion of the side wall in the interior of the housing;

a guide member disposed to be adjacent to a portion of the side wall in the interior of the housing and surrounding another portion of the seating part; and at least one electronic component including a body part and a protrusion disposed on one surface of the body part, wherein the electronic component is guided by the guide member to enter the seating part along a direction that is inclined with respect to the side wall or the first surface and is mounted on the seating part.

An electronic device according to various embodiments of the disclosure may include:

a housing including a first plate facing a first direction, a second plate facing a second direction that is opposite to the first direction, and a side member surrounding a space between the first plate and the second plate;

an inner surface disposed in the first plate and facing the second direction;

an inner flange disposed at a portion of the side member, disposed to be spaced apart from the inner surface, and protruding to the space along a third direction that is perpendicular to the first direction;

a touchscreen display exposed through a first portion of the first plate;

a camera module exposed through a second portion of the first plate, wherein the second portion is located between the first portion and the portion of the side member when viewed from the top of the first plate, wherein the camera module includes:

a substrate disposed between the second portion and the second plate;

a plurality of lenses stacked toward the second portion;

a barrel holding the plurality of lenses while having a first diameter; and a holder provided to surround the barrel while being connected to the substrate, and including a first surface facing the inner surface, wherein the barrel moves with respect to the holder, and a portion of the barrel protrudes from the first surface by a first distance, and wherein a portion of the camera module is interposed between the inner flange and the second portion;

a wireless communication circuit disposed in the housing;

a processor disposed in the housing, and electrically connected to the touchscreen display, the camera module, and the wireless communication circuit; and a first structure disposed in the housing at a location that is spaced apart from the portion of the side member by a second distance, wherein the holder of the camera module is interposed between the portion of the side member and the first structure, the first structure includes a second surface facing the second direction, and a third surface, the second surface and the third surface are aligned along the portion of the side member and are spaced apart from the portion of the side member by a third distance that is larger than the first diameter, and a fourth distance from the inner surface to the second surface or from the inner surface to the third surface is set to be larger than the first distance.

The electronic device according to various embodiments of the disclosure can prevent interference with an electronic component (e.g., a camera module) and an internal structure while not forming a separate avoidance space and facilitate assembling (or separation) of an electronic component by guiding the electronic component by using a guide member when the electronic component is mounted.

According to various embodiments of the disclosure, because the internal structures of the electronic device can spatially and electrically isolate the electronic components as the avoidance space is reduced, a physical contact or an electromagnetic interference between the electronic components can be alleviated and prevented in the assembling or separation process.

DETAILED DESCRIPTION

Figure 1:
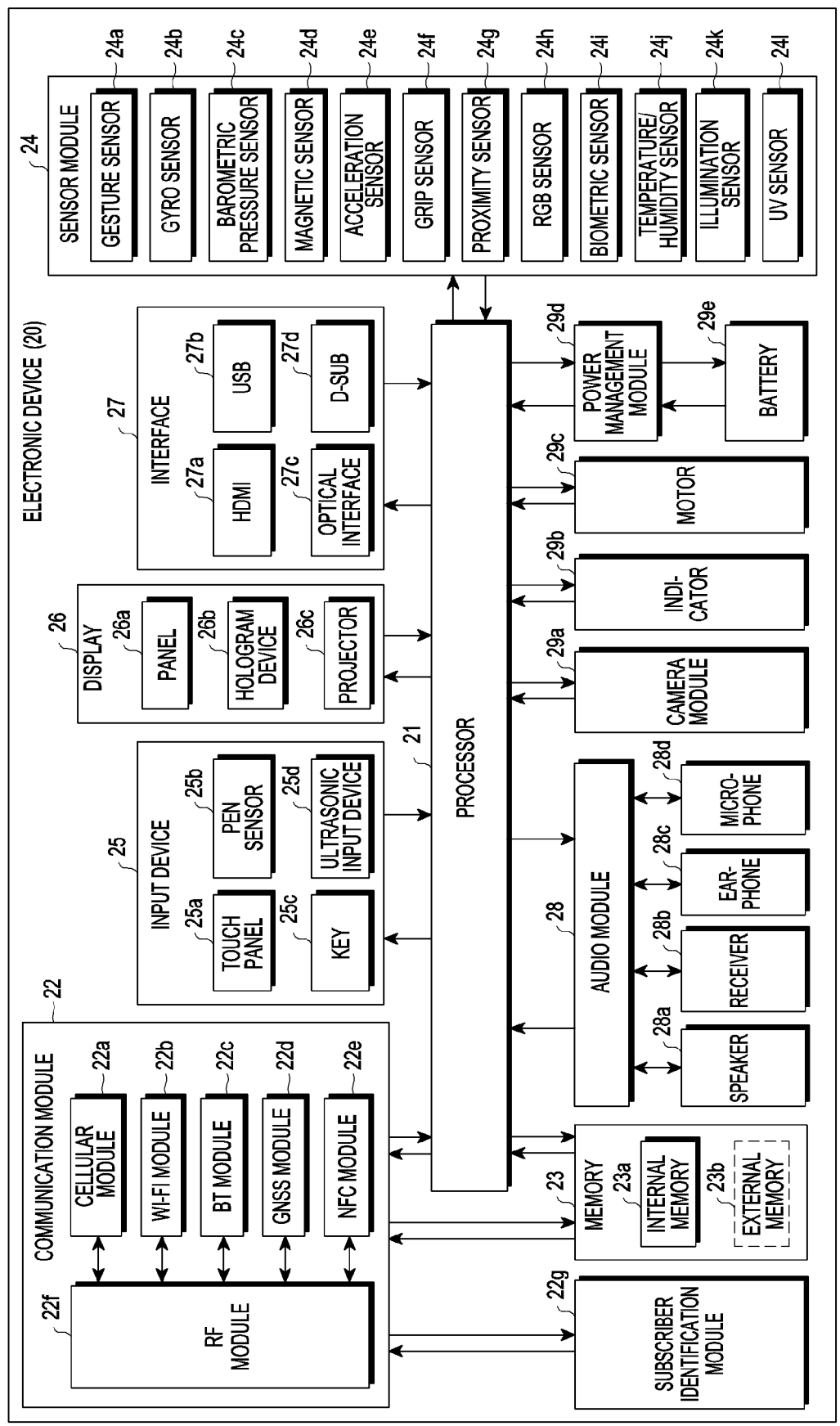
FIG. 1 is a block diagram of an electronic device according to various embodiments of the disclosure.

As the disclosure allows for various changes and numerous embodiments, some exemplary embodiments will be described in detail with reference to the accompanying drawings. However, the disclosure is not limited to specific disclosed forms, but it is understood that the scope of the disclosure include all changes pertaining to the spirit and technical scope of the disclosure, equivalents or replacements thereof.

The terms including ordinal numbers, such as 'first' and 'second', may be used to describe various elements, but the elements are not limited to the terms. The terms may be used only for the purpose of distinguishing one element from another element. For example, without departing the scope of the disclosure, a first element may be referred to as a second element, and similarly, a second element may be referred to as a first element. The term of 'and/or' includes a combination of a plurality of related items described or any one of a plurality of related items described.

Further, the relative terms, such as 'a front surface, 'a rear surface', 'an upper surface', and 'a lower surface', which are described with reference to the drawings may be replaced by ordinal numbers, such as 'first' and 'second'. The order of the ordinal numbers, such as 'first' and 'second' are determined in the described order or arbitrarily and may be arbitrarily changed if necessary.

The terminologies used herein are provided only to describe specific embodiments and are not intended to limit the disclosure. The terms of a singular form may include plural forms unless otherwise specified. The terms "including" and "having" are used to designate that the features, the numbers, the steps, the operations, the elements, the parts, or combination thereof described in the specification are present, and may be understood that one or more other features, numbers, steps, operations, elements, parts, or combinations thereof may be added.

In addition, unless defined otherwise, all terms used herein, including technical or scientific terms, have the same meanings as those generally understood by those skilled in the art to which the disclosure pertains. The terms defined in generally used dictionaries should be construed as having meanings that coincide with the meanings of the contexts of the related technologies and should not be construed as ideal or excessively formal meanings unless clearly defined in the specification of the disclosure.

In the disclosure, the electronic device may be an arbitrary device including a touch panel, and the electronic device may be referred to as a terminal, a portable terminal, a mobile terminal, a communication terminal, a portable communication terminal, a portable mobile terminal, and a display device.

For example, the electronic device may be a smartphone, a portable phone, a navigation device, a gaming device, a TV, a head unit for a vehicle, a notebook computer, a laptop computer, a tablet computer, a personal media player (PMP), and a person digital assistant (PDA). The electronic device may be implemented as a portable communication terminal of a pocket size, which has a wireless communication function. Further, the electronic device may be a flexible device or a flexible display device.

The electronic device may communicate with an external electronic device, such as a server, and may perform an operation in conjunction with an external electronic device. For example, the electronic device may transmit an image captured by a camera or location information detected by a sensor unit, to a server through a network. The network is not limited thereto, but may be a mobile or cellular communication network, a local area network (LAN), a wireless local area network (WLAN), a wide area network (WAN), the internet, and a small area network (SAN).

FIG. 1 is a block diagram 20 illustrating an electronic device according to various embodiments of the disclosure.

The electronic device 20 may include at least one processor 21 (e.g., an Application Processor (AP)), a communication module 22, a subscriber Identification module 22g, a memory 23, a sensor module 24, an input device 25, a display 26, an interface 27, an audio module 28, a camera module 29a, a power management module 29d, a battery 29e, an indicator 29b, and a motor 29c. The processor 21 may control a plurality of hardware or software elements connected thereto and may perform various data processing and operations by driving an operating system or an application program. The processor 21, for example, may be implemented by a system on chip (SoC). According to an embodiment, the processor 21 may further include a graphic processing unit (GPU) and/or an image signal processor. The processor 21 may include at least some (e.g., a cellular module 22a) of the elements illustrated in FIG. 1. The processor 21 may load, in a volatile memory, instructions or data received from at least one of the other elements (e.g., a non-volatile memory), process the loaded instructions or data, and store the result data in the non-volatile memory. In some embodiments, the processor 21 may be disposed in the housing of the electronic device (e.g., the electronic device 100 of FIG. 2 and the like, which will be described below) and may be electrically connected to a wireless communication circuit (e.g., the communication module 22) disposed in the housing of the electronic device, a touchscreen display (e.g., the display panel 123 of FIG. 4) disposed in the housing of the electronic device, and a camera module (e.g., the camera module 29a or the electronic component 105 of FIG. 10, which will be described below) disposed in the housing of the electronic device.

The communication module 22, for example, may include a cellular module 22a, a Wi-Fi module 22b, a Bluetooth module 22c, a GNSS module 22d, an NFC module 22e, and a radio frequency (RF) module 22f. The cellular module 22a, for example, may provide a voice call, a video call, a text message service, an internet service, etc. through a communication network. According to an embodiment, the cellular module 22a may distinguish and authenticate the electronic device 20 in the communication network by using the subscriber identification module 22g (e.g., a SIM card). According to an embodiment, the cellular module 22a may perform at least some of the functions that the processor 21 may provide. According to an embodiment, the cellular module 22a may include a communication processor (CP). According to some embodiments, at least some (e.g., two or more) of the cellular module 22a, the Wi-Fi module 22b, the Bluetooth module 22c, the GNSS module 22d, or the NFC module 22e may be included in a single integrated chip (IC) or an IC package. The RF module 22f, for example, may transmit and receive a communication signal (e.g., an RF signal). The RF module 22f, for example, may include a transceiver, a power amplifier module (PAM), a frequency filter, a low noise amplifier (LNA), or an antenna. According to another embodiment, at least one of the cellular module 22a, the Wi-Fi module 22b, the Bluetooth module 22c, the GNSS module 22d, or the NFC module 22e may transmit and receive an RF signal through a separate RF module. The subscriber identification module 22g, for example, may include a card that includes a subscriber identity module and/or an embedded SIM, and may contain unique identification information (e.g., an integrated circuit card identifier (ICCID)) or subscriber information (e.g., an international mobile subscriber identity (IMSI)).

The memory 23, for example, may include an internal memory 23a or an external memory 23b. The internal memory 23a, for example, may include at least one of a volatile memory (e.g., a DRAM, an SRAM, an SDRAM, or the like) and a non-volatile memory (e.g., a one-time programmable ROM (OTPROM), a PROM, an EPROM, an EEPROM, a mask ROM, a flash ROM, a flash memory, a hard disc drive, or a solid state drive (SSD)). The external memory 23b, for example, may include a flash drive a compact flash (CF), a secure digital (SD), a micro-SD, a mini-SD, an eXtreme digital (xD), a multi-media card (MMC), or a memory stick. The external memory 23B may be functionally or physically connected to the electronic device 20 through various interfaces.

The sensor module 24, for example, may measure a physical quantity or detect the operating state of the electronic device 20 and convert the measured or detected information into an electrical signal. The sensor module 24, for example, may include at least one of a gesture sensor 24a, a gyro sensor 24b, an atmospheric pressure sensor 24c, a magnetic sensor 24d, an acceleration sensor 24e, a grip sensor 24f, a proximity sensor 24g, a color sensor 24h (e.g., a red/green/blue (RGB) sensor), a biometric sensor 24i, a temperature/humidity sensor 24j, an illumination sensor 24k, or an ultraviolet (UV) sensor 240l. Additionally or alternatively, the sensor module 24, for example, may include an e-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 24 may further include a control circuit for controlling one or more sensors included therein. In some embodiments, the electronic device 20 may further include a processor configured to control the sensor module 24 as a part of or separately from the processor 21 and may control the sensor module 24 while the processor 21 is in a sleep state. In some embodiments, if the electronic device 20 includes a fingerprint sensor or an iris sensor for security, the fingerprint sensor and the iris sensor may be provided as parts of the sensor module 24.

The input device 25, for example, may include a touch panel 25a, a (digital) pen sensor 25b, a key 25c, or an ultrasonic input device 25d. The touch panel 25a, for example, may use at least one of a capacitive type, a resistive type, an infrared type, and an ultrasonic type. Further, the touch panel 25a may further include a control circuit. The touch panel 25a may further include a tactile layer and may provide a tactile reaction to a user. The (digital) pen sensor 25b, for example, may include a recognition sheet that is a part of, or separate from, the touch panel. The key 25c, for example, may include a physical button, an optical key, or a keypad. The ultrasonic input device 25d may detect ultrasonic waves generated by an input tool through a microphone (e.g., the microphone 28d) and may identify data corresponding to the detected ultrasonic waves.

The display 26 may include a panel 26a, a hologram device 26b, a projector 26c, or a control circuit for controlling them. The panel 26a may be implemented to be, for example, flexible, transparent, or wearable. The panel 26a may be formed as a single module together with the touch panel 25a. According to an embodiment, the panel 26a may include a pressure sensor (or a force sensor) which may measure the strength of pressure of a user's touch. The pressure sensor may be implemented so as to be integrated with the touch panel 25a or may be implemented as one or more sensors separate from the touch panel 25a. The hologram device 26b may show a three dimensional image in the air by using interference of light. The projector 26c may display an image by projecting light onto a screen. The screen, for example, may be located at the inside or outside of the electronic device 20. The interface 27, for example, may include a high-definition multimedia interface (HDMI) 27a, a universal serial bus (USB) 27b, an optical interface 27c, or a D-subminiature (D-sub) 27d. Additionally or alternatively, the interface 27 may, for example, include a mobile high-definition link (MHL) interface, a secure digital (SD) card/multi-media card (MMC) interface, or an infrared data association (IrDA) standard interface.

The audio module 28 may convert, for example, sound into an electrical signal, and vice versa. The audio module 28, for example, may process sound information that is input or output through a speaker 28a, a receiver 28b, earphones 28c, the microphone 28d, etc. The camera module 29a is a device that can photograph a still image and a moving image, and according to an embodiment, may include one or more image sensors (e.g., a front sensor or a rear sensor), a lens, an image signal processor (ISP), or a flash (e.g., an LED or xenon lamp). In an embodiment, the camera module 29a may include an additional image sensor for sensing an iris image. The power management module 29d may manage, for example, the power of the electronic device 20. According to an embodiment, the power management module 29d may include a power management integrated circuit (PMIC), a charger IC, or a battery or fuel gauge. The PMIC may use a wired and/or wireless charging method. Examples of the wireless charging method may include a magnetic resonance method, a magnetic induction method, an electromagnetic wave method, and the like. Additional circuits (e.g., a coil loop, a resonance circuit, a rectifier, and the like) for wireless charging may be further included. The battery gauge may measure, for example, the residual quantity of the battery 29e, and a voltage, a current, or a temperature while charging. The battery 29e, for example, may include a rechargeable battery and/or a solar battery.

The indicator 29b may indicate a particular state (e.g., a booting state, a message state, a charging state, etc.) of the electronic apparatus 20 or a part thereof (e.g., the processor 21). The motor 29c may convert an electrical signal into a mechanical vibration and may generate a vibration, a haptic effect, or the like. The electronic device 20 may include a mobile TV support device that can process media data according to a standard, such as digital multimedia broadcasting (DMB), digital video broadcasting (DVB), media-Flo™, and the like. Each of the above-described component elements of hardware according to the disclosure may include one or more elements, and the names of the corresponding elements may change on the basis of the type of electronic device. In various embodiments, an electronic device (e.g., the electronic device 20) may omit some elements or may further include additional elements, or some of the elements of the electronic device may be combined with each other to configure one entity, in which case the electronic device may identically perform the functions of the corresponding elements prior to the combination.

Figure 2:
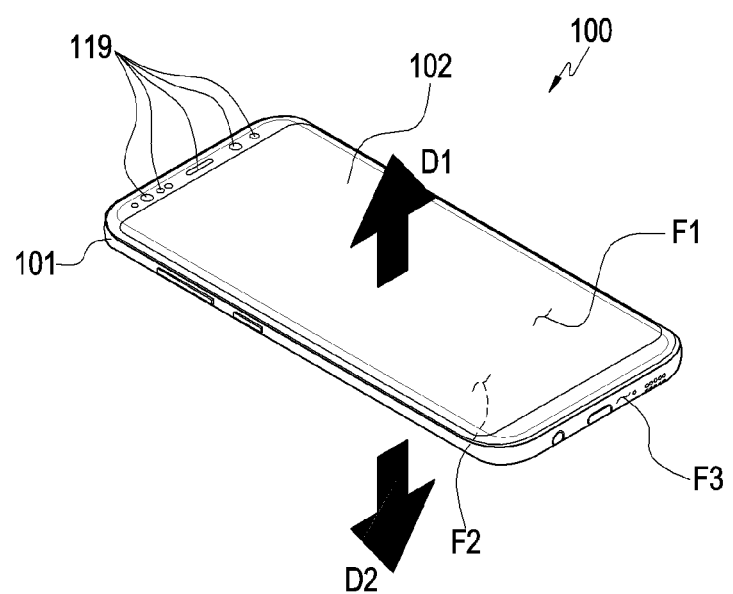
FIG. 2 is a perspective view illustrating an electronic device according to various embodiments of the disclosure.
Figure 3:
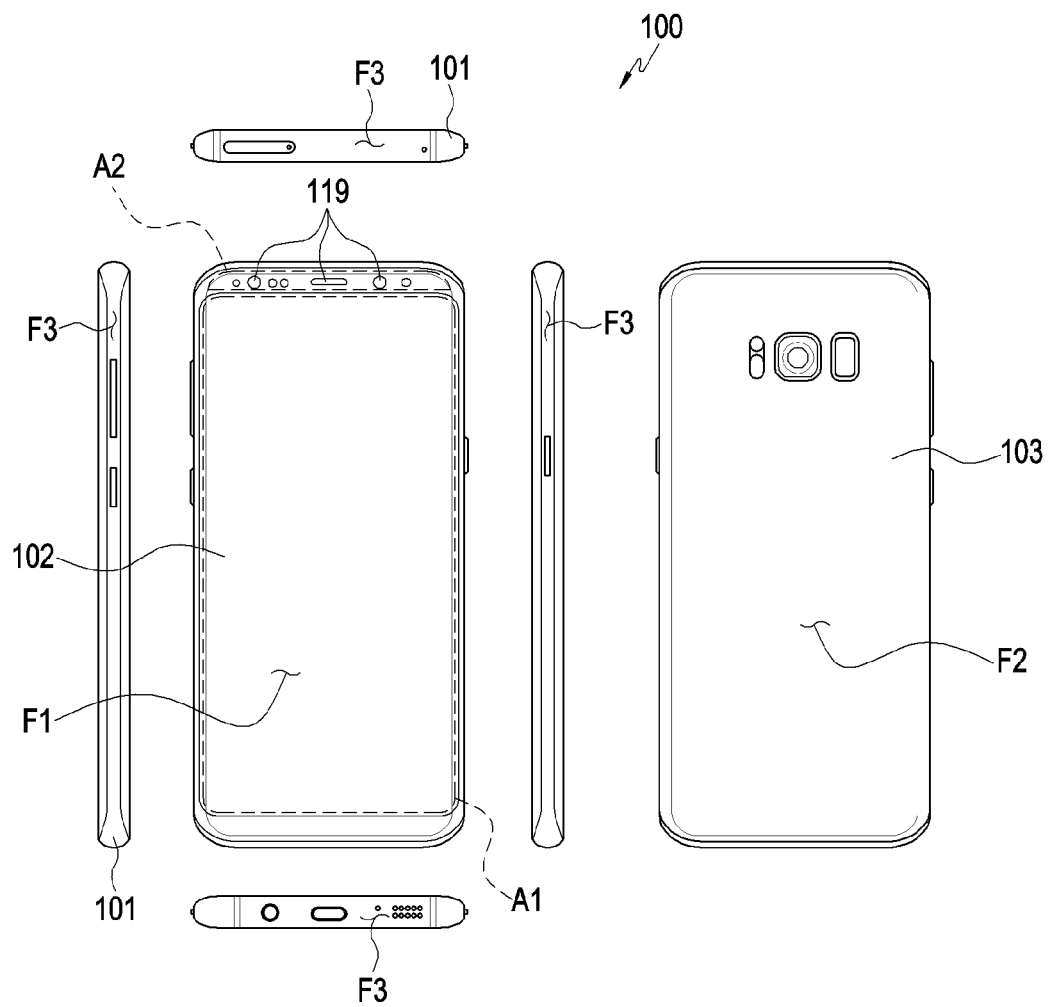
FIG. 3 is a set of six drawings illustrating an electronic device according to various embodiments of the disclosure.

FIG. 2 is a perspective view illustrating an electronic device 100 according to various embodiments of the disclosure. FIG. 3 is a set of six drawings illustrating an electronic device 100 according to various embodiments of the disclosure.

Referring to FIGS. 2 and 3, the electronic device 100 (e.g., the electronic device 20 of FIG. 1) may include a housing 101, a first cover member 102, and a second cover member 103. The first cover member 102 may be mounted on one surface of the housing 101 to define a first surface F1 of the housing 101, which faces a first direction D1. The second cover member 103 may be mounted on an opposite surface of the housing 101 to define a second surface F2 of the housing 101, which faces a second direction D2 that is opposite to the first direction D1.

In a detailed description of an embodiment of the disclosure, reference symbol '101' denotes 'a housing' but the disclosure is not limited thereto. For example, the element denoted by reference symbol '101' may be referred to as 'a side member' or 'a reinforcement member' and may be coupled to a first plate (e.g., the first cover member 102) that faces the first direction D1 and a second plate (e.g., the second cover member 103) that faces the second direction D2 to define the housing of the electronic device 100. A side wall F3 may be a part of 'the side member' or 'the reinforcement member'.

According to various embodiments, the side wall member (e.g., the housing 101) may be configured to at least partially surround a space between the first cover member 102 and the second cover member 103. For example, at least the side wall F3 of the housing 101 may be disposed to surround the space between the first cover member 102 and the second cover member 103.

In some embodiments, the first cover member 102 may be attached to a support piece (e.g., a first support piece 101b of FIG. 5 which will be described below) extending from a portion of the side wall F3 to be coupled to the housing 101. For example, the first plate (e.g., an inner surface (e.g., an inner side surface) of the first cover member 102) may be disposed to face the second direction D2. According to an embodiment, the support piece for coupling the first cover member 102 may have a closed curve shape when viewed from the top of the first surface F1 and may be attached to an edge of the first cover member 102. As the support piece having a closed curve shape is coupled to the edge of the first cover member 102, the housing 101 and the first cover member 102 are sealed to configure a dustproof and waterproof structure.

According to various embodiments, a double-sided tape or an adhesive may be interposed between the housing 101 (e.g., the support piece extending from the side wall F3) and the first cover member 102 to bond the first cover member 102 to the housing 101 and may configure a dustproof and waterproof structure. In some embodiments, a separate coupling member (a frame or a screw) may be utilized when the first cover member 102 is coupled to the housing 101, and an elastic body, such as rubber, may be provided between the housing 101 and the first cover member 102 to configure a dustproof and waterproof structure. The dustproof and waterproof structure may be variously configured according to the function or specification of the electronic device.

According to various embodiments, openings 119 for sensing external environment information or inputting and outputting a sound or an image may be provided at an upper end portion of the first cover member 102. The 'opening' disposed at the upper end portion of the first cover member 102 may have a form of a through-hole that spatially connects the inner space and the outer space of the first cover member 102. In some embodiments, the 'opening' disposed at the upper end portion of the first cover member 102 may have a form of a window that temporally exposes the inner space and the outer space of the first cover member 102, but spatially isolates the inner space and the outer space of the first cover member 102. For example, a sound and the like may be input and output through some of the openings 119, and through others of the openings 119, an input/output of the sound may be blocked but optical information may be input and output. In some embodiments, the electronic component(s) such as the receiver 28b, the gesture sensor 24a, the proximity sensor 24f, the biometric sensor 24i, the illumination sensor 24k, the UV sensor 24l, and the camera module 29a of FIG. 1 may be disposed in correspondence to one of the openings 119. In some embodiments, the electronic component(s) may be disposed not to correspond to the opening 119. For example, the electronic components such as a gyro sensor, an acceleration sensor, a motor, and a microphone may not be disposed to correspond to the opening 119.

According to various embodiments, the second cover member 103, for example, is a rear cover of the electronic device 100, and may be formed of one or a combination of two selected from various materials, such as glass, a metal, and a synthetic resin. Although it will be described later, the second cover member 103 may be attached to an inner flange or a support piece (e.g., the second support piece 101c of FIG. 5, which will be described below) extending from the side wall F3 to be coupled to the housing 101. According to an embodiment, the inner flange for coupling the second cover member 103 may have a closed curve shape when viewed from the top of the second surface F2 and may be attached to an edge of the second cover member 102. As the inner flange (or the support piece) having a closed curve shape is coupled to the edge of the second cover member 103, the housing 101 and the second cover member 103 are sealed to configure a dustproof and waterproof structure.

The dustproof and waterproof structure may be variously formed through a double-sided tape, an adhesive, or a combination of a separate coupling member and an elastic member. In some embodiments, even though the inner flange or the support piece disposed in the side wall F3 does not have a closed curve shape, a dustproof and waterproof structure may be disposed according to the disposition of the double-sided tape. According to various embodiments of the disclosure, the dustproof and waterproof structure may be variously disposed according to the function of the electronic device and the shapes and dispositions of various parts (e.g., the housing 101 or the first and second cover members 102 and 103).

Figure 4:
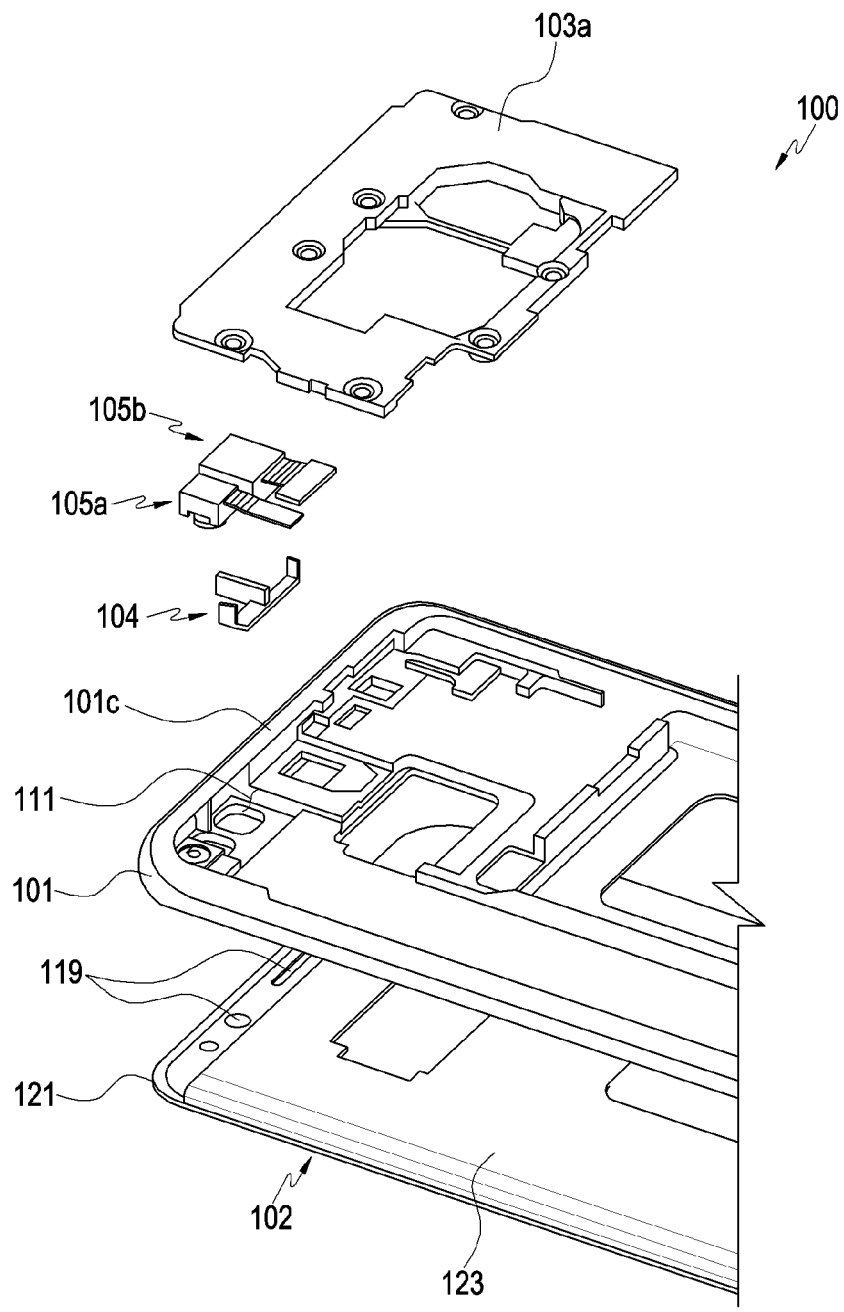
FIG. 4 is an exploded perspective view illustrating main parts of an electronic device according to various embodiments of the disclosure.
Figure 5:
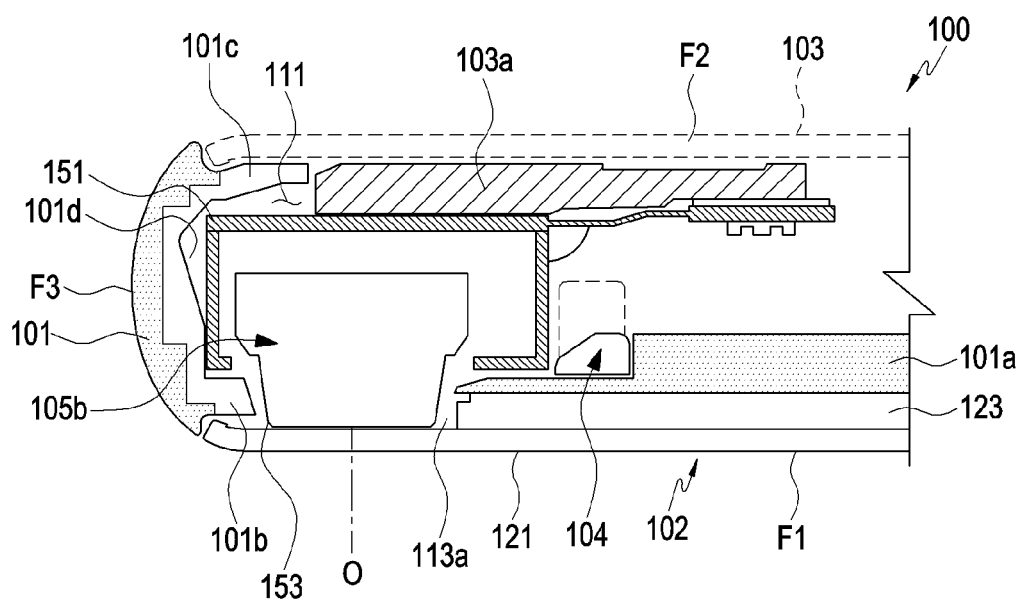
FIG. 5 is a cross-sectional view illustrating main parts of an electronic device according to various embodiments of the disclosure.

FIG. 4 is an exploded perspective view illustrating main parts of an electronic device 100 according to various embodiments of the disclosure. FIG. 5 is a cross-sectional view illustrating the main parts of an electronic device 100 according to various embodiments of the disclosure.

Referring to FIGS. 4 and 5, an electronic device 100 (e.g., the electronic device 20 and 100 of FIG. 1 or FIG. 2) according to various embodiments of the disclosure may include at least one electronic component 105a and 105b disposed in the interior of the housing 101 and a first structure that guides assembling of the electronic components 105a and 105b, for example, the guide member 104. In some embodiments, the electronic device 100 may further include a support 103a that is coupled to the second surface F2 of the housing 101 to support the electronic components 105a and 105b.

According to an embodiment, the first cover member 102 may be a display device in which the window member 121 and the display panel 123 are combined. In some embodiments, the first cover member 102 may be a touchscreen display device including a touch panel integrated in the window member 121 or the display panel 123. The display panel 123 may be coupled to an inner surface of the window member 121, and openings 119 (e.g., the openings 119 of FIG. 2) may be disposed at one end of the window member 121. On the inner surface of the window member 121, an area (e.g., a first portion A1 of FIG. 3 as a portion at which the display panel 123 or the touch panel is disposed) in which the display panel 123 is disposed, and an area (e.g., a second portion A2 of FIG. 3 as a portion at which the electronic components 105a and 105b are disposed) in which the openings 119 are arranged may not overlap each other. For example, the electronic components 105a and 105b may be disposed to correspond to the openings 119, respectively, without overlapping the display panel 123.

According to various embodiments, the display panel, in which the display panel 123 or the touch panel is integrated, may be exposed through the first portion A1, and at least one of the electronic components 105a and 105b, such as a camera module, may be exposed through the second portion A2. In some embodiments, when viewed from the top of the first plate (e.g., the first cover member 102), the second portion may be located between the first portion and a portion (e.g., a portion of the side wall F3) of the side member.

According to various embodiments, a seating part 111 for disposing the electronic components 105a and 105b may be provided in the interior of the housing 101. The seating part 111, for example, may mean a space that is defined or surrounded by a portion of the side wall F3 and the guide member 104. According to an embodiment, the first structure, for example, the guide member 104 may be disposed in the interior of the housing 101 at a location that is spaced apart from a portion (e.g., a portion of the side wall F3) of the side member by a predetermined distance (e.g., the second distance H2 of FIG. 14, which will be described below), and may define the seating part 111 together with a portion of the side wall F3.

According to an embodiment, the seating part 111 may be defined by combining an imaginary plane(s) (or a curved surface(s)) that passes through a portion and another portion of the guide member 104 and an imaginary plane(s) (or a curved surface(s)) that passes through a portion of the inner surface of the side wall F3, a portion of the side wall F3, and a portion of the guide member 104. In some embodiments, a plurality of seating parts 111 may be disposed to correspond to the electronic components disposed in the housing 101. In another embodiment, a plurality of electronic components may be disposed in one seating part 111. In another embodiment, when a plurality of electronic components are disposed in one seating part 111, a portion of the guide member 104 may divide the seating part 111 into a plurality of spaces.

According to various embodiments, the housing 101 may include a first support piece 101b that extends from at least a portion of the side wall F3 while being located to be close to the first surface F, and an inner flange, for example, a second support piece 101c that extends from at least a portion of the side wall F3 while being located to be close to the second surface F3. In an embodiment, the second support piece 101c may be disposed at a portion of the side wall F3, may protrude along a third direction that is perpendicular to the first direction (e.g., the first direction D of FIG. 2), and may be located in a space between the first plate (e.g., the first cover member 102 of FIG. 3) and the second plate (e.g., the second cover member 103 of FIG. 3). According to an embodiment, a portion of the second support piece 101c is spaced apart from an inner surface (e.g., the inner side surface) of the first cover member 102, and an undercut structure may be disposed inside the side wall F3. In some embodiments, the undercut structure may be disposed in a form that is not the structure of the second support piece 101c. For example, the undercut structure may be defined by a recessed portion disposed on the inner surface of the side wall F3.

According to various embodiments, the first support piece 101b may further include a through-hole 113a corresponding to the seating part 111. The through-hole 113a may hold a portion (e.g., a protrusion 153) of the electronic component (e.g., the electronic components 105a and 105b) disposed in the seating part 111. As described above, the first support piece 101b and the second support piece 101c may provide a unit for coupling the first cover member 102 and the second cover member 103 to the housing 101. In some embodiments, when viewed from the top of the first surface F1 (or the second surface F2), the first support piece 101b and the second support piece 101c may define closed curve shapes, respectively, and may be attached to the edges of the first cover member 102 and the second cover member 103, respectively.

Although the term 'support piece' is used for a simple description, in a detailed embodiment of the disclosure, at least one of the first support piece 101b and the second support piece 101c may have a plate shape. For example, the height or thickness of the first support piece 101b may be partially different, but may have a substantially plate shape, and the edge portion of the first support piece 101b may be coupled to the edge of the first cover member 102, and a central portion (e.g., a portion denoted by reference symbol '101a') of the first support piece 101b may be coupled substantially to a central portion (e.g., the display panel 123) of the first cover member 101b. The height or thickness of the first support piece 101b may be partially different according to the locations, sizes, and shapes of the electronic component(s) disposed in the interior of the electronic device 100, and integrated circuit chip(s) disposed in a main circuit board.

According to various embodiments, as the second support piece 101c (or the first support piece 101b) extends from the side wall F3, an undercut structure may be configured on the inner surface of the side wall F3. In an embodiment, the undercut structure may be utilized as a space for holding and mounting the electronic component(s) 105a and 105b. For example, the seating part 111 may at least partially include an undercut structure disposed on the inner surface of the side wall F3. In an embodiment, the undercut structure may further include an avoidance recess 101d that partially surrounds the seating part 111 together with the first support piece 101b and the second support piece 101c. The avoidance recess 101d, for example, has a shape that is partially recessed on the inner surface of the side wall F3, and may hold a portion of the electronic components 105a and 105b when the electronic components 105a and 105b are assembled. In some embodiments, in a state (e.g., the state illustrated in FIG. 5) in which the electronic components 105a and 105b are assembled in the seating part 111, a portion of the surface that defines the avoidance recess 101d may be inclined with respect to the outer surfaces of the electronic components 105a and 105b.

According to various embodiments, the electronic components 105a and 105b may enter and be mounted on the seating part 111 (e.g., the undercut structure) in a horizontal direction (e.g., a direction that is parallel to the first surface F1 in FIG. 5) or a direction (e.g., a direction that is inclined to the left and lower sides from the right and upper sides of FIG. 5) that is inclined at an arbitrary angle. In some embodiments, when the electronic components 105a and 105b include a protrusion 153, an avoidance space in which the protrusion 153 may move while the electronic components 105a and 105b enter the seating part 111 or the undercut structure along the horizontal direction may be required. In another embodiment, when the electronic components 105a and 105b include a protrusion, the protrusion 153 of the electronic components 105a and 105b may be interfered and damaged by an inner structure of the electronic device 100, for example, a portion of the housing 101 while the electronic components 105a and 105b enter the seating part along a direction that is inclined at an arbitrary angle.

Because the electronic device (e.g., the electronic device 100) according to various embodiments of the disclosure may include the guide member 104, an interference between the electronic components 105a and 105b (e.g., the protrusion 153) and another structure can be prevented while the electronic components 105a and 105b enter and are mounted on the seating part 111 (e.g., the undercut structure), making it possible to assemble the electronic components 105a and 105b, even though a separate avoidance space is not configured. The assembling of the electronic components 105a and 105b using the guide member 104 will be discussed in more detail through FIGS. 14 to 22.

According to various embodiments, the guide member 104 is disposed to be adjacent to a portion of the side wall F3 in the interior of the housing 101 to surround another portion of the seating part 111. Hereinafter, the structure of the guide member 104 will be discussed further with reference to FIGS. 6 and 7.

Figure 6:
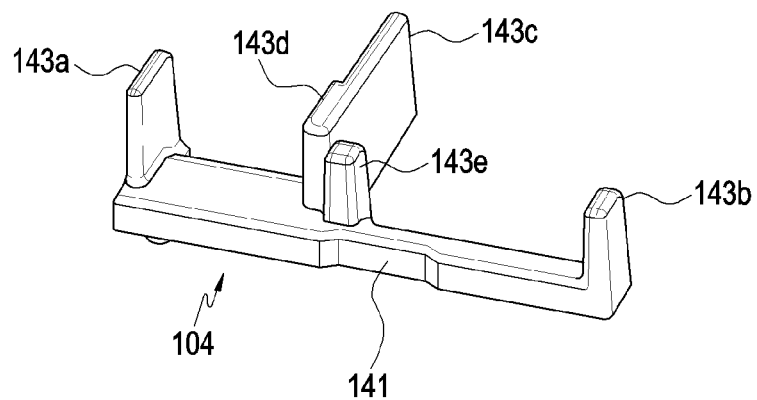
FIG. 6 is a perspective view illustrating a guide member of an electronic device according to various embodiments of the disclosure.
Figure 7:
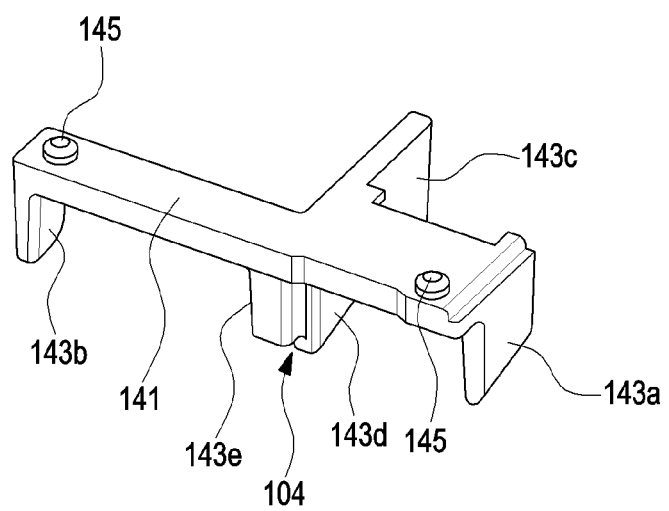
FIG. 7 is a perspective view illustrating a guide member of an electronic device according to various embodiments of the disclosure, viewed from another direction.

FIG. 6 is a perspective view illustrating a guide member 104 of an electronic device according to various embodiments of the disclosure. FIG. 7 is a perspective view illustrating a guide member 104 of an electronic device according to various embodiments of the disclosure, viewed from another direction.

Referring to FIGS. 6 and 7, the guide member 104 may include a fixing portion 141 and guide ribs 143a, 143b, and 143c. The guide ribs 143a, 143b, 143c, may have different shapes according to the shapes of the electronic components corresponding thereto, respectively. In an embodiment, if the guide member 104 guides assembling of a plurality of electronic components (e.g., n electronic components, 'n' is a natural number), the guide member 104 may include (n+1) guide ribs 143a, 143b, and 143c. In some embodiments, if the guide member 104 guides assembling of a plurality of electronic components, some of the guide ribs 143a, 143b, and 143c may be disposed between adjacent two electronic components, respectively.

According to various embodiments, the fixing portion 141 has a shape corresponding to one edge of the seating part 111, and may be mounted on the housing 101, for example, on the first support piece 101b. The electronic device 100 may further include a bonding member for attaching and fixing the fixing portion 141 to the housing 101. In some embodiments, according to the material of the guide member 104 or the fixing portion 141, the fixing portion 141 may be mounted on the housing 101 by applying an adhesive or in various methods, for example, using a snap fit structure or screws. In an embodiment, the fixing portion 141 may include at least one engaging boss 145 disposed on a surface that faces the housing 101 (e.g., the first support piece 101d).

According to various embodiments, the guide ribs 143a, 143b, and 143c may extend from different surfaces of the fixing portion 141 in a direction that is opposite to the engaging boss 145. In an embodiment, when being mounted on the housing 101, the upper end surfaces of the guide ribs 413a, 143b, and 143c may be disposed to face the second direction (e.g., the second direction D2 of FIG. 2). In an embodiment, the guide ribs 143a, 143b, and 143c may have different shapes. For example, the guide member 104 illustrated in FIG. 6 is a structure that guides assembling of the two electronic components, and may include a first guide rib 143a, a second guide rib 143b, and/or a third guide rib 143c having different shapes. In an embodiment, the third guide rib 143c may include a first shape portion 143d corresponding to the first rib 143a and a second shape portion 143e corresponding to the second guide rib 143b. For example, the first guide rib 143a and the first shape portion 143d may guide assembling of, among the electronic components 105a and 105b, the first electronic component 105a, and the second guide rib 143b and the second shape portion 143e may guide assembling of, among the electronic components 105a and 105b, the second electronic component 105b.

According to various embodiments, the third guide rib 143c may include a plate structure that at least partially divides a space, in which the first electronic component (e.g., the first electron component 105a of FIG. 4) is assembled, and a space, in which the second electronic component (e.g., the second electronic component 105b of FIG. 4) is assembled. For example, the third guide rib 143c may be disposed between the two adjacent electronic components. In some embodiments, the guide member 104, for example, at least the third guide rib 143c may interrupt electromagnetic interferences. In an embodiment, the entire guide member 104 may be manufactured of a metallic material that can shield electromagnetic fields.

Figure 8:
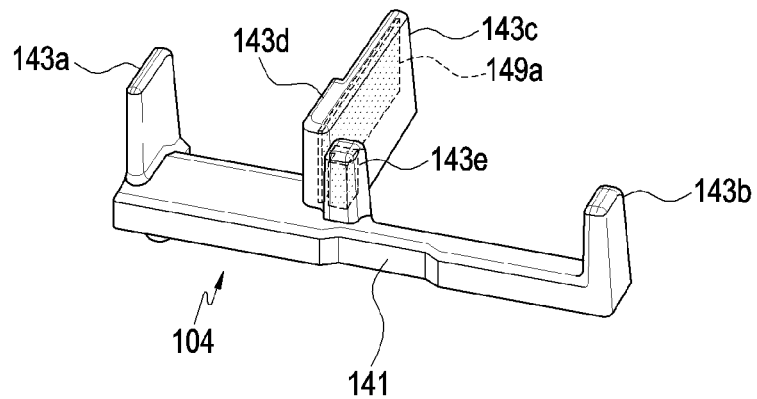
FIGS. 8 and 9 are perspective views illustrating other examples of a guide member of an electronic device according to various embodiments of the disclosure, respectively.
Figure 9:
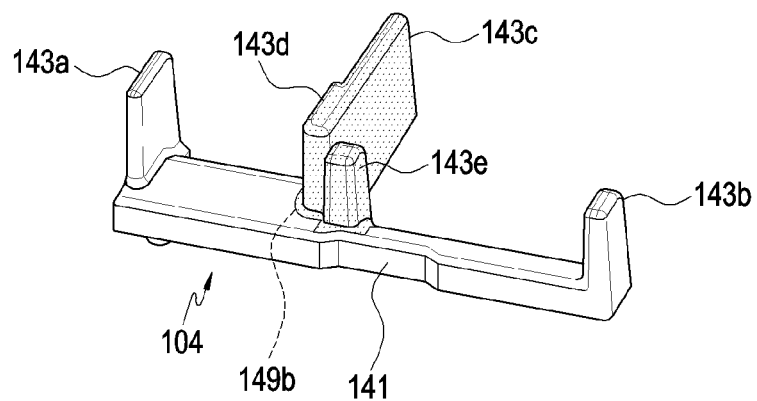

FIGS. 8 and 9 are perspective views illustrating other examples of a guide member of an electronic device according to various embodiments of the disclosure, respectively.

Referring to FIGS. 8 and 9, in provision of an electromagnetic field shielding function, at least the third guide rib 143c of the guide member 104 may include an electromagnetic field shielding material (e.g., a metallic material). For example, as illustrated in FIG. 8, the third guide rib 143c may have an injection-molded shape in which an electromagnetic field shielding foil is embedded through insert injection-molding, and as illustrated in FIG. 9, at least an outer peripheral surface of the third guide rib 143c may be coated with an electromagnetic field shielding material. For example, some of the guide ribs 143a, 143b, and 143c may divide installation spaces (e.g., the seating part of FIG. 4) of the adjacent electronic components, or may interrupt electromagnetic interferences between the adjacent electronic components.

Referring to FIGS. 4 and 5 again, the electronic components 105a and 105b, for example, may include a protrusion 153. For example, the electronic components 105a and 105b may include a body part (e.g., the body part 151 of FIG. 10) and a protrusion 153 disposed on one surface (e.g., the one surface 151a of FIG. 10) of the body part 151. Although a configuration in which the electronic components 105a and 105b are provided will be discussed in the embodiment, it is noted that the disclosure is not limited thereto. For example, the electronic components, such as a proximity sensor or an illumination sensor, include a body part and may include a protrusion. Hereinafter, the structure of the electronic components 105a and 105b will be discussed further with reference to FIGS. 10 and 11.

Figure 10:
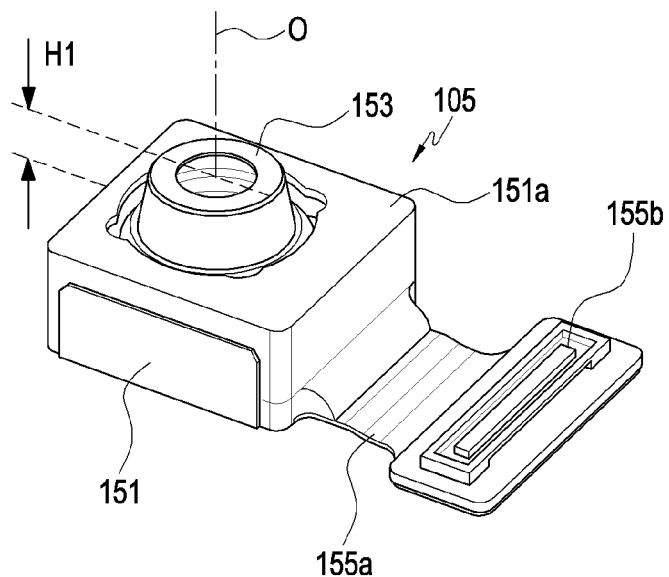
FIG. 10 is a perspective view illustrating an example of an electronic component of an electronic device according to various embodiments of the disclosure.
Figure 11:
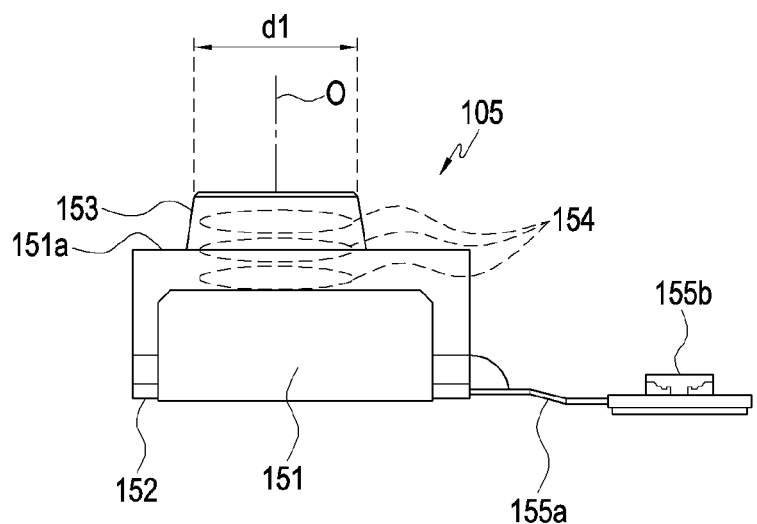
FIG. 11 is a side view illustrating an example of an electronic component of an electronic device according to various embodiments of the disclosure.

FIG. 10 is a perspective view illustrating an example of an electronic component 105 of an electronic device according to various embodiments of the disclosure. FIG. 11 is a side view illustrating an example of an electronic component 105 of an electronic device according to various embodiments of the disclosure.

Referring to FIGS. 10 and 11, the electronic component 105, for example, is a camera module, and may include a body part 151 and a protrusion 153 disposed on one surface 151a of the body part 151. The protrusion 153, for example, may be a barrel that holds a plurality of lenses 154 stacked on one another while having a first diameter dl. In an embodiment, the body part 151 may be a holder that is provided to surround the protrusion 153 (e.g., the barrel) and is connected to the board 152 on which an image sensor is mounted. The board 152, for example, may be electrically connected to a main circuit board (e.g., the processor 21 of FIG. 1) of the electronic device (e.g., the electronic device 100 of FIG. 2) through a flexible printed circuit board 155a and a connector 155b provided in the printed circuit board 155a. In some embodiments, the board 152 may be a part of the flexible printed circuit board 155a.

According to various embodiments, at least a portion of the protrusion 153 may protrude from one surface 151a of the body part 151 (e.g., the holder) by a first distance (H1), and may move with respect to the body part 151. For example, the protrusion 153 may be coupled to the body part 151 in a state in which the protrusion 153 may proceed and retreat in the directions of the optical axes O of the embedded lenses 154. In some embodiments, the electronic device (e.g., the electronic device 20 of FIG. 1 or the processor 21) may allow the barrel holding the lens, for example, the protrusion 153 to proceed and retreat to perform an automatic focusing function or a zoom-in/zoom-out function. In some embodiments, the electronic component 105 may be utilized as an iris recognition sensor that senses an iris image of a user.

Referring to FIG. 5 again, if the electronic component 105b (e.g., the electronic component 105 of FIG. 10) is disposed in the seating part 111, the body part 151 (e.g., the holder of the camera module) is inserted between a portion (e.g., a portion of the side wall F3) of the side member and the first structure (e.g., the guide member 104), one surface (e.g., one surface 151a of FIG. 10) of the body part 151 is disposed to at least partially face the inner surface (inner side surface) of the first plate (e.g., the first cover member 102), and the board 152 may be disposed between the second portion (e.g., the second portion A2 of FIG. 3) of the first plate (e.g., the first cover member 102) and the second plate (e.g., the second cover member 103). In some embodiments, if the electronic component 105b (e.g., the electronic component 105 of FIG. 10) is disposed in the seating part 111, a portion of the protrusion 153 may be disposed in the through-hole 113a, and if the protrusion 153 holds a plurality of lenses (e.g., the lens 154 of FIG. 11), at least one of the lenses 154 may be disposed to face the second portion (e.g., the second portion A2 of FIG. 3) of the first plate. For example, if the electronic component 105b (e.g., the camera module) is disposed in the seating part 111, a portion of the electronic component 105b may be interposed between the second portion (e.g., the second portion A2 of FIG. 3) of the first cover member 102 and the inner flange (e.g., the second support piece 101c).

The protrusion 153 may be at least partially held in the through-hole 113a disposed in the first support piece 101b. The through-hole 113a may be disposed to correspond to one of the openings (e.g., the opening 119 of FIG. 4) disposed in the first cover member 102. For example, if the electronic component 105b is a camera module or an iris sensor, external image information (e.g., optical information) may be input through the through-hole 113a or the opening 119.

Figure 12:
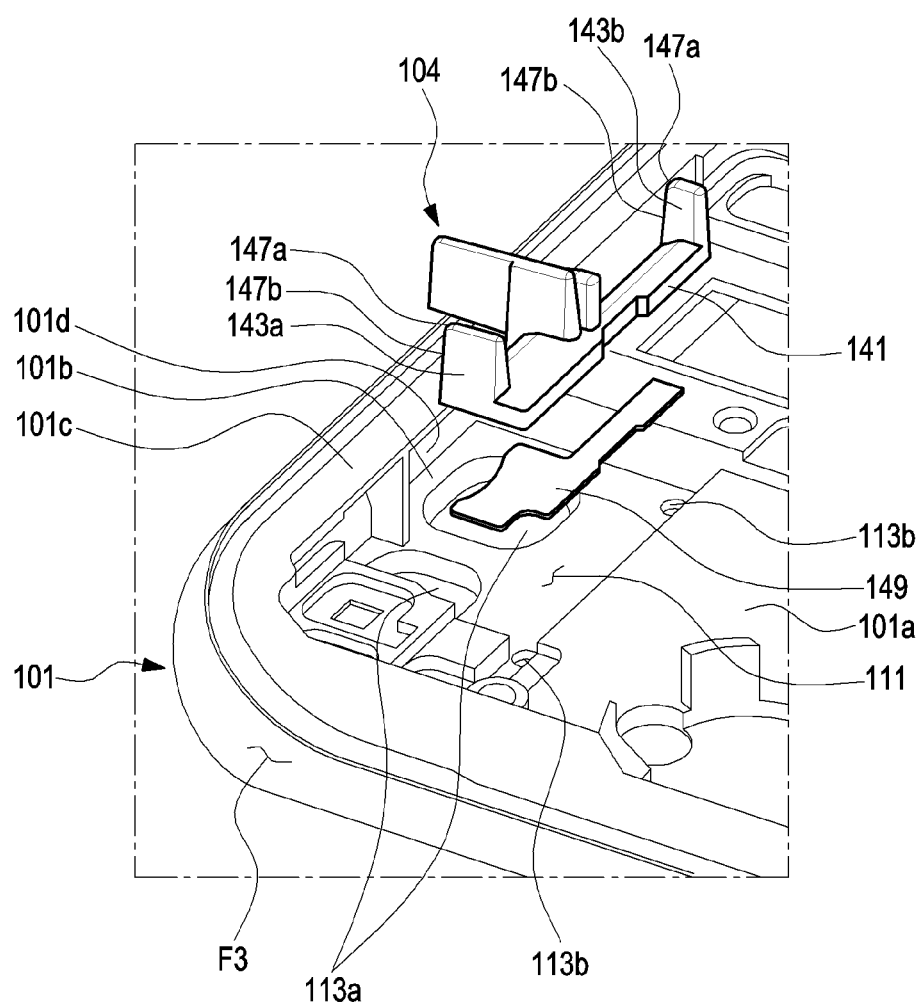
FIG. 12 is an exploded perspective view illustrating a state in which a guide member of an electronic device according to various embodiments of the disclosure is mounted on a housing.
Figure 13:
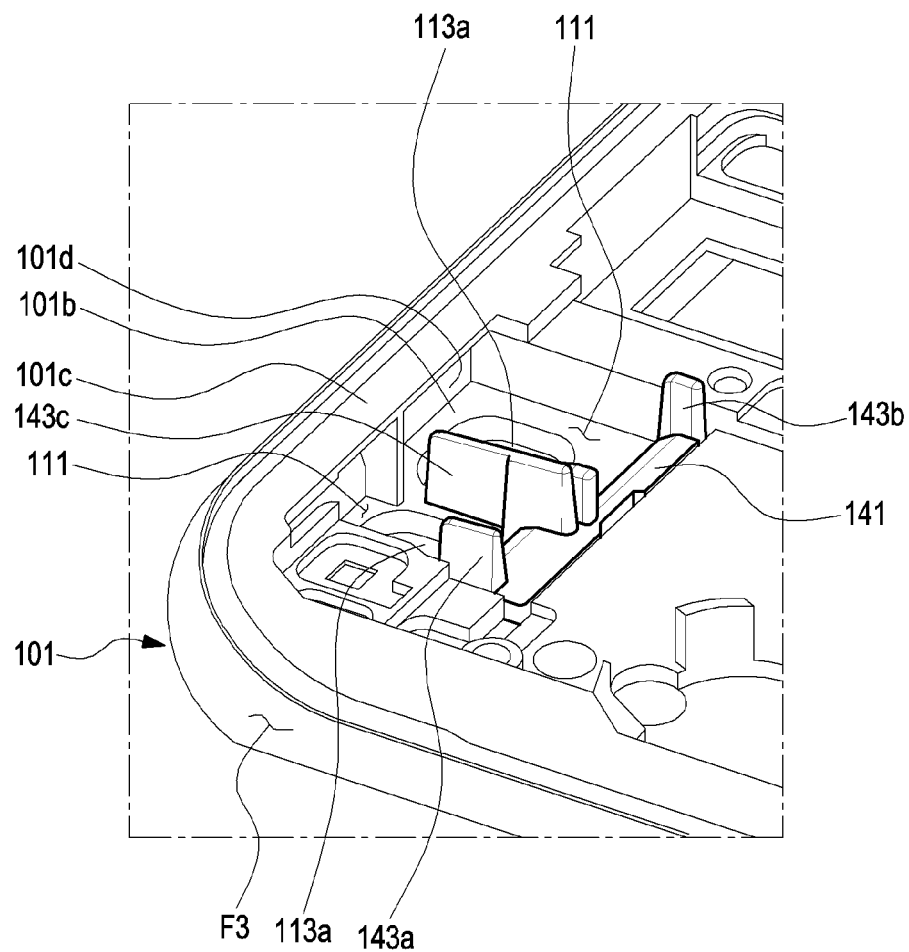
FIG. 13 is a perspective view illustrating a state in which a guide member of an electronic device according to various embodiments of the disclosure is mounted on a housing.

FIG. 12 is an exploded perspective view illustrating a state in which a guide member 104 of an electronic device according to various embodiments of the disclosure is mounted on a housing 101. FIG. 13 is an exploded perspective view illustrating a state in which a guide member 104 of an electronic device according to various embodiments of the disclosure is mounted on a housing 101.

Referring to FIGS. 12 and 13, the housing 101 may include a first support piece 101b and a second support piece 101c disposed in the side wall F3, and the first support piece 101b may have a plate shape defined or disposed in an area surrounded by the side wall F3. An avoidance recess 101d disposed to surround a portion of the seating part 111 may be disposed on the inner surface of the side wall F3 with the first support piece 101b and the second support piece 101c therebetween. At least one through-hole(s) 113a may be disposed in the first support piece 101b. The through-hole 113a may be located on the seating part 111 and may provide a photographing path according to the function of the electronic component in which the seating part 111 is disposed. For example, the through-hole 113a may correspond to the electronic component that provides a photographing function.

According to an embodiment, at least one engaging hole(s) 113b may be disposed in the first support piece 101b. The engaging hole 113b may be located on the seating part 111 and may be engaged with the engaging boss (e.g., the engaging boss 145 of FIG. 7) disposed in the guide member 104. For example, the engaging hole 113b may be engaged with the guide boss disposed in the guide member 104 to set a mounting location of the guide member 104.

According to various embodiments, the guide member 104 may include a fixing portion 141 and a plurality of guide ribs 143a, 143b, and 143c and may be attached and fixed to the first support piece 101b through a bonding member 149. According to an embodiment, on the first support piece 101b, the side wall F3 (e.g., the inner surface of the side wall F3) may be disposed at an edge on one side of the seating part 111 and the guide member 104 may be disposed at an edge of the opposite side of the seating part 111, and the through-hole 113a may be located between the side wall F3 and the guide member 104. For example, the electronic component disposed in the seating part 111 may be disposed to correspond to the through-hole 113a between the inner surface of the side wall F3 and the guide member 104.

According to various embodiments, the guide ribs may include a first guide rib 143a and a second guide rib 143b disposed at opposite ends of the fixing portion 141, and a third guide rib 143c that extends to partially cross the seating part 111 between the first guide rib 143a and the second guide rib 143b. In some embodiments, the third guide rib 143c may include a first shape portion (e.g., the first shape portion 143d of FIGS. 6 and 7) corresponding to the first guide rib 143a and a second shape portion (e.g., the second shape portion 143e of FIGS. 6 and 7) corresponding to the second guide rib 143b.

According to various embodiments, the first and second guide ribs 143a and 143b may include a curved guide part 147a and a linear guide part 147b along ends of the first and second guide ribs 143a and 143b, which face the side wall F3. The curved guide part 147a may be disposed at upper ends of the first and second guide ribs 143a and 143b, and the linear guide part 147b may extend in the direction of the first support piece 101b and/or a direction connected to the fixing portion 141 from the curved guide part 147a. In some embodiments, the first and second shape portions 143d and 143e may include a curved guide part and a linear guide part to correspond to the shapes of the first and second guide ribs 143a and 143b.

According to various embodiments, if the guide member 104 is mounted on the first support piece 101b, the seating part 111 may be disposed in an area surrounded by an imaginary plane (or a curved surface) that passes through the first and second guide ribs 143a and 143b and the inner structure (e.g., portions of the side wall F3 and the first support piece 101b) of the housing 101. According to an embodiment, the third guide rib 143c may be disposed inside the seating part 111 and the seating part 111 may be divided into two spaces. The expression of 'being divided into two spaces' does not mean complete spatial separation. For example, it is not necessary to cause an end of the third guide rib 143c to contact or be connected to the inner surface of the side wall F3, and the third guide rib 143c extends on the first support piece 101b between the adjacently disposed electronic components to partially separate the assembling space of the electronic components or guide or configure an assembling location. According to an embodiment, the guide member 104 may provide an electromagnetic shielding function. For example, at least the third guide rib 143c may be disposed between the adjacent two electronic components to interrupt electromagnetic interference between two electronic components. In some embodiments, the third guide rib 143c may be formed of a metallic material, be coated with a metallic material, or have a metallic foil therein to provide an electromagnetic shielding function.

Hereinafter, referring to FIG. 14, a configuration of guiding and assembling the electronic component(s) in the electronic device while being guided by the guide member according to various embodiments of the disclosure will be described. In a description of the embodiment, although an iris recognition sensor, a camera module, and the like will be described for the electronic component as an example, the disclosure does not have to be limited thereto. For example, the electronic device according to various embodiments of the disclosure may include various forms of sensors, such as a proximity sensor and an illumination sensor, a motor for providing a haptic function, and a microphone or a speaker for inputting and outputting a sound, as the electronic component, and the guide member, which has been described above and/or will be described below, can be utilized in assembling the electronic component.

Figure 14:
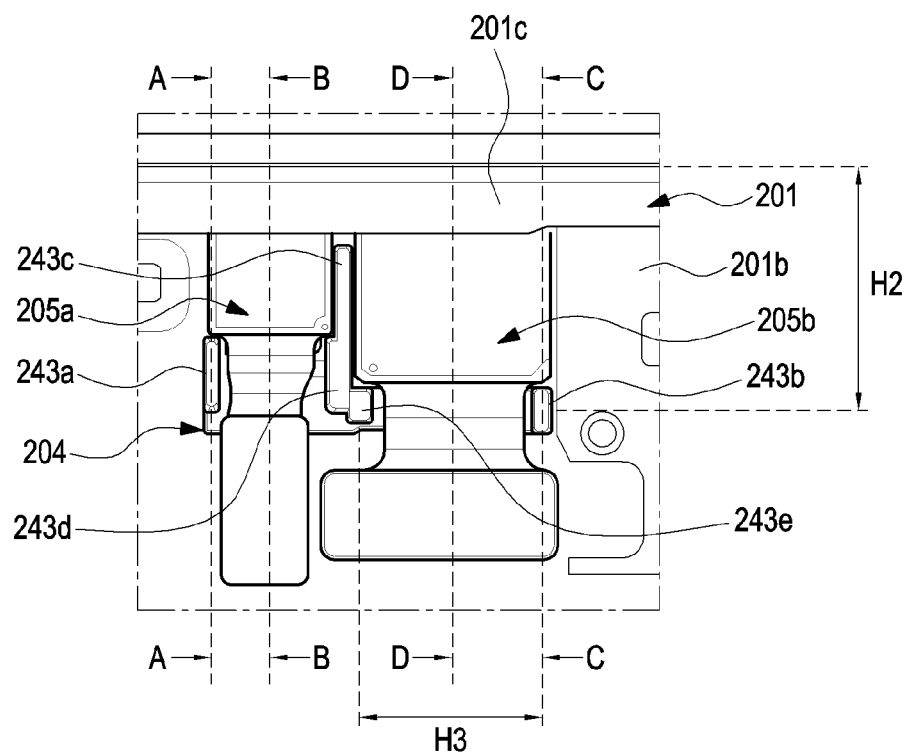
FIG. 14 is a plan view illustrating a state in which an electronic component of an electronic device according to various embodiments of the disclosure is assembled.
Figure 15:
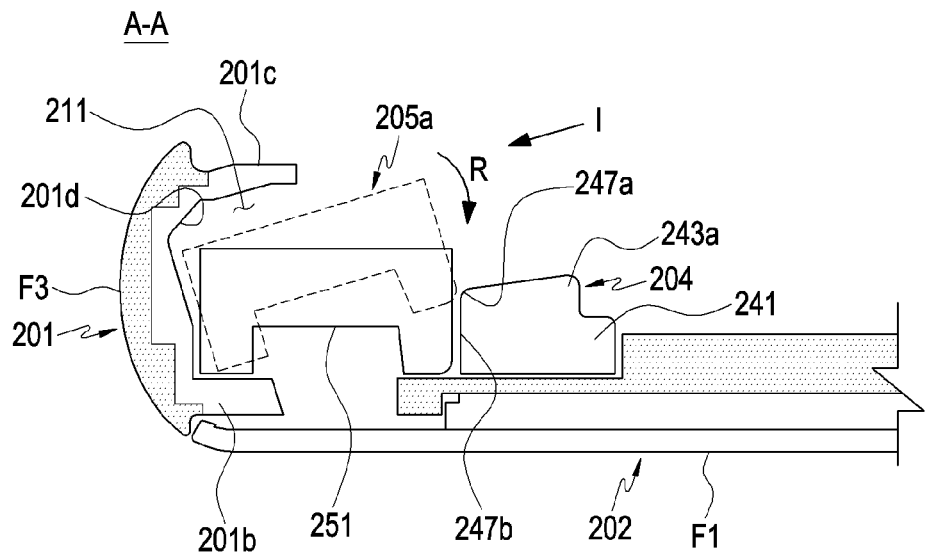
FIG. 15 is a cutaway cross-sectional view illustrating an electronic device according to various embodiments of the disclosure, taken along line A-A of FIG. 14.
Figure 16:
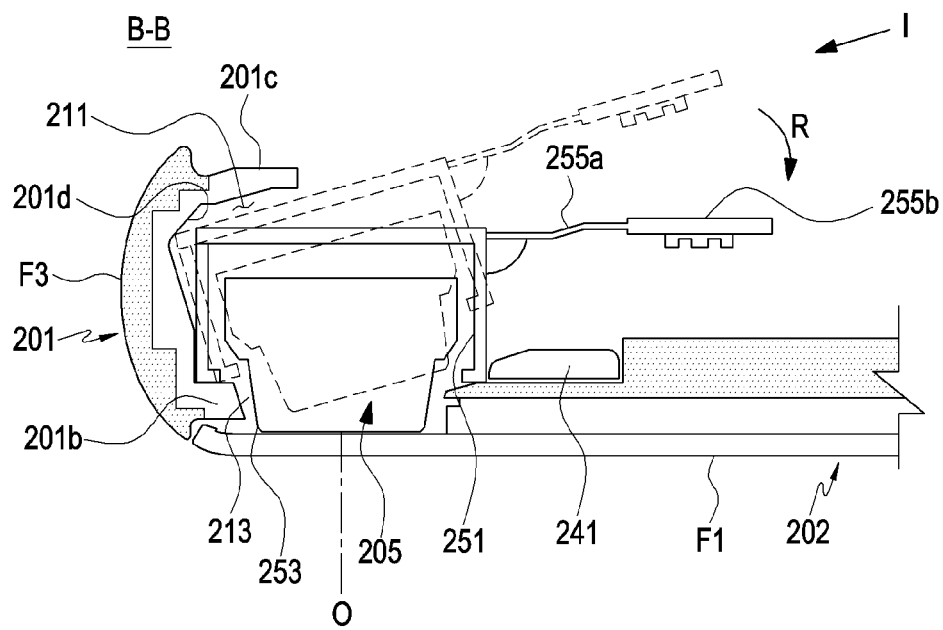
FIG. 16 is a cutaway cross-sectional view illustrating an electronic device according to various embodiments of the disclosure, taken along line B-B of FIG. 14.
Figure 17:
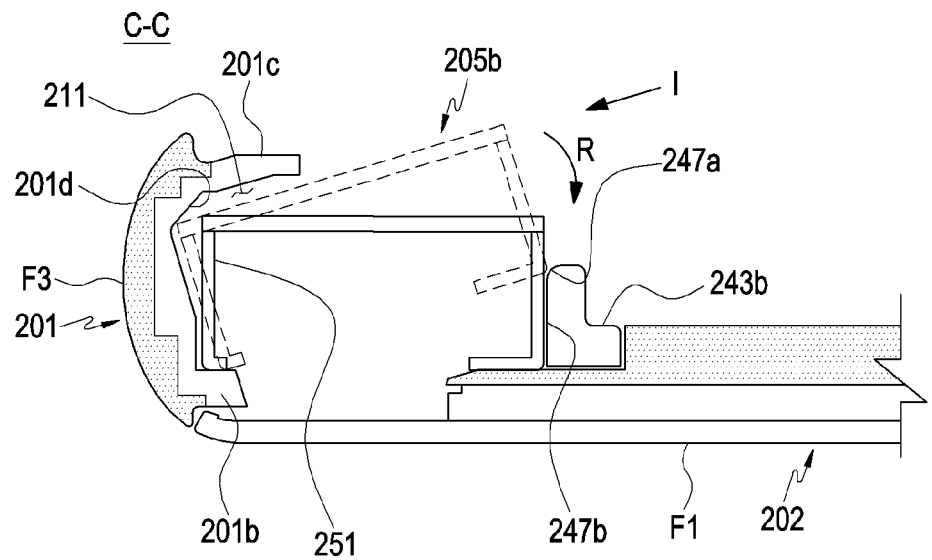
FIG. 17 is a cutaway cross-sectional view illustrating an electronic device according to various embodiments of the disclosure, taken along line C-C of FIG. 14.
Figure 18:
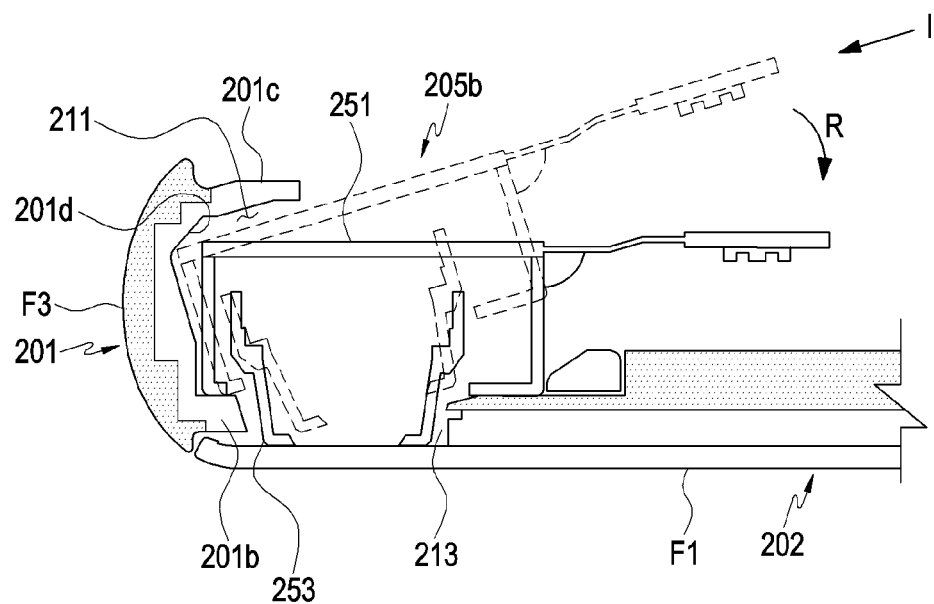
FIG. 18 is a cutaway cross-sectional view illustrating an electronic device according to various embodiments of the disclosure, taken along line D-D of FIG. 14.

FIG. 14 is a plan view illustrating a state in which electronic components 205a and 205b of an electronic device according to various embodiments of the disclosure are assembled. FIG. 15 is a cutaway cross-sectional view illustrating an electronic device according to various embodiments of the disclosure, taken along line A-A of FIG. 14. FIG. 16 is a cutaway cross-sectional view illustrating an electronic device according to various embodiments of the disclosure, taken along line B-B of FIG. 14. FIG. 17 is a cutaway cross-sectional view illustrating an electronic device according to various embodiments of the disclosure taken along line C-C of FIG. 14. FIG. 18 is a cutaway cross-sectional view illustrating an electronic device according to various embodiments of the disclosure taken along line D-D of FIG. 14.

Referring to FIG. 14, the first structure, for example, the guide member 204 may include a second surface and a third surface that face a second direction (e.g., the second direction D2 of FIG. 2). The 'second surface', for example, may mean an upper end surface of the second guide rib 243b and the 'third surface' may mean an upper end surface of the second shape portion 243e. The upper end surfaces of the second guide rib 243b and the second shape portion 243e may be aligned along a portion of the above-described side member (e.g., a portion of the side wall F3 of FIG. 5). According to an embodiment, the second surface and the third surface may be disposed at a location that is spaced apart from a portion of the side member by a second distance H2. The 'second distance H2' may be variously determined according to the size of the electronic component 205a and 205b assembled while being guided by the first structure, for example, the guide member 204. In a description of a detailed embodiment of the disclosure, an interval between the side member and the guide member 204 or an interval between the side member and the second guide rib 243b (or the second shape portion 243e) is generally referred to as the 'second distance H2', but the 'second distance H2' is an interval that is necessary to stably fix the electronic component 205a or 205b while substantially holding the electronic component 205a or 205b and may mean an interval between the side member and the second guide rib 243b (or the second shape portion 243e).

According to various embodiments, an interval between the second surface (e.g., the upper end surface of the second guide rib 243b) and the third surface (e.g., the upper end surface of the second shape portion 243e) may be spaced apart by a third distance H3 that is larger than the above-described first diameter (e.g., the first diameter dl of FIG. 11). For example, if the electronic component 205b includes a protrusion (e.g., the protrusion 153 of FIG. 10 or the barrel), the protrusion may enter the seating part (e.g., the seating part 111 of FIG. 13) through a space between the second surface and the third surface.

In some embodiments, the protrusion or the barrel may have partially different diameters. According to various embodiments of the disclosure, the shape of the second guide rib 243b or the second shape portion 243e may be properly changed according to the shape of the protrusion (or the barrel) of the electronic component 205b. For example, the second guide rib 243b or the second shape portion 243e may have a shape and a disposition that may provide a path for entering the seating part while the protrusion (or the barrel) of the electronic component 205b is not interfered with by another structure.

According to various embodiments, a plurality of electronic components 205a and 205b may be guided by the guide member 204 and may be mounted on the housing 201 of the electronic device. Among the electronic components 205a and 205b, the first electronic component 205a, for example, may include an iris recognition sensor, and the second electronic component 205b may include a camera module. In a state in which the electronic components 205a and 205b are mounted on the housing 201, one surface of the electronic components 205a and 205b is disposed to face the first support piece 201b of the housing 201, and when viewed from the top of the second surface (e.g., the second surface F2 of FIG. 2 or FIG. 3) of the housing 201, another surface of the electronic components 205a and 205b may be partially disposed inside the second support piece 201c. For example, the electronic components 205a and 205b may be partially held in the undercut structure disposed in the side wall (e.g., the side wall F3 of FIG. 13) of the housing 201 and may be partially covered by the second support piece 201c when viewed from the second surface (e.g., the second surface F2 of FIG. 2 or FIG. 3). According to an embodiment, the guide member 204 may include a plurality of guide ribs 243a, 243b, and 243c. For example, if n electronic components 205a and 205b ('n' is a natural number) are mounted while being guided by the guide member 204, the guide member 204 may include (n+1) guide ribs. According to an embodiment, some of the (n+1) guide ribs may be disposed between the contacting two electronic components to spatially separate or electromagnetically isolate the electronic components.

According to various embodiments, the electronic components 205a and 205b may be mounted on the housing 201 in a state in which corner portions of the electronic components 205a and 205b are adjacent to or in contact with the first guide rib 243a or the second guide rib 243b (and/or the first shape portion 243d or the second shape portion 243e of the third guide rib 243c). For example, in a process of assembling the electronic components 205a and 205b, the guide member 204 may guide and set the assembling and mounting locations of the electronic components 205a and 205b.

Referring to FIGS. 15 and 16, in the process of assembling, among the electronic components, the first electronic component 205a in the housing 201, the body part 251 enters (I) the seating part 211 while slide-contacting the first guide rib 243a or the first shape portion 243d in a process of assembling the housing 201, and the protrusion 253 may enter the interior of the seating part 211 without being interfered by another structure and be disposed to correspond to the through-hole 213 while the body part 251 slide-contacts the first guide rib 243a. The protrusion 253 may proceed or retreat along the direction of the optical axis O on the body part 251 and may be partially held in the through-hole 213.

According to various embodiments, the body part 251 may enter (I) the second support piece 201c (e.g., the seating part 211) while the edge portions of the opposite side of one surface (the one surface 151a of FIG. 10 in which the protrusion 253 is disposed) slide-contact the first guide rib 243a and the third guide rib 243c (e.g., the first shape portion 243d). For example, the operator may cause the body part 251 to enter the seating part 211 in a state in which the one side surface of the body part 251 contacts one side surface of the third guide rob 243c. While the body part 251 enters (I) the seating part 211, the opposite edge portions of the one surface (e.g., the surface on which the protrusion 253 is disposed) of the body part 251 may slide-contact the first guide rib 243a and the first shape portion 243d, respectively. According to an embodiment, when the body part 251 enters (I) the seating part 211 in a state in which the body part 251 slide-contacts the first guide rib 243a, it may enter a space provided by the undercut structure disposed inside the seating part 211, for example, the second support piece 201c along a direction that is inclined with respect to the side wall F3 or the first surface F2. In an embodiment, while the body part 251 enters the space provided by the seating part 211 and/or the undercut structure, the protrusion 253 may enter the seating part 211 through a space between the first guide rib 243a and the third guide rib 243c (e.g., the first shape portion 243d). For example, while the first electronic component 205a is guided by the guide member 204 and enters the seating part 211, the protrusion 253 may enter the seating part 211 without being interfered with by another structure.

According to various embodiments, the body part 251 enters the seating part 211 by a predetermined degree, and the front end portion of one surface (e.g., the one surface 151a of FIG. 10 as a surface on which the protrusion 253 is disposed) of the body part 251 may contact the first support piece 201b. In an embodiment, from a state in which the front end portion on one surface of the body part 251 contacts the first support piece 201b, the first electronic component 205a may further enter the seating part 211. In another embodiment, while the first electronic component 205a further enters the seating part 211, the front end portion on the one surface of the body part 251 may slide-contact the first support piece 201b, and the rear end portion of the one surface of the body part 251 may contact the first guide rib 243a or the first shape portion 243d. For example, the body part 251 is in a state in which the body part 251 is inclined at a first angle (e.g., an angle θ2 of FIG. 20) with respect to the first surface F1 in a state in which the front end portion contacts the first support piece 201b and the rear end portion contacts the first guide rib 243a or the first shape portion 243d and may maintain a state in which the body part 251 is inclined with respect to the first surface F1 at an angle that is larger than the first angle while entering the seating part 211 before reaching the first angle.

According to various embodiments, in a state (hereinafter, a 'first mounting state') in which the front end portion on one surface of the body part 251 contacts the first support piece 201b and the rear end portion on one surface of the body part 251 contacts the first guide rib 243a (or the first shape portion 243d), a portion of the body part 251 may be located in the avoidance recess (e.g., the avoidance recess 101d of FIG. 5) disposed in the side wall F3. According to an embodiment, in the first mounting state, a portion of the protrusion 253 may be located in the through-hole 213, and another portion of the protrusion 253 may be located in the seating part 211. According to another embodiment, in the first mounting state, the rear end portion of one surface of the body part 251 may be in a state in which the rear portion substantially contacts a curved guide part 247a (e.g., the curved guide part 147a of FIG. 12) of the first guide rib 243a and may move in a direction in which the rear portion is adhered to the first support piece 201b while sequentially slide-contacting the curved guide part 247a and the linear guide part 247b (e.g., the linear guide part 147b of FIG. 12) of the first guide rib 243a.

According to various embodiments, while the rear end portion of one surface of the body part 251 moves in a direction in which the rear end portion is adhered to the first support piece 201b while slide-contacting the linear guide part 247b, the first electronic component 205a may substantially rotate (R) in the seating part 211, and a portion of the body part 251 may deviate from the avoidance recess on the inner surface of the side wall F3. If the rear end portion on one surface of the body part 251 is adhered to the first support piece 201b, one surface of the body part 251 may be substantially adhered to the first support 201b. While the first electronic component 205a rotates (R) in the seating part 211 (e.g., the rear end portion on one surface of the body part 251 moves in a direction in which the rear end portion is adhered to the first support piece 201b), another portion (a portion located in the seating part 211 in the first mounting state) of the protrusion 253 may be located in the through-hole 213 while moving along a linear or curved locus.

Referring to FIGS. 17 and 18, the second electronic component 205b, for example, may be a camera module including a body part 251 and a protrusion 253 disposed to proceed and retreat on one surface of the body part 251. The protrusion 253 may be a lens barrel including a plurality of lenses and may provide an automatic focusing function or a zoom-in/zoom-out function. In some embodiments, the protrusion 253 may at least partially protrude from one surface of the body part 251. In an embodiment, when the protrusion 253 is disposed to proceed and retreat on the body part 251, interference with another structure may damage the protrusion 253 or the procession/retraction mechanism for the protrusion 253. According to various embodiments of the disclosure, the guide member (e.g., the guide member 104 of FIG. 6 or FIG. 7) may prevent the protrusion 253 from being interfered with by another structure in a process of assembling the electronic component (e.g., the second electronic component 205b).

According to various embodiments, the second electronic component 205b may be guided by the second guide rib 243b and the third guide rib 243c (e.g., the second shape portion 243e) of the guide member 204 and may enter the seating part 211 (e.g., the undercut structure disposed in the side wall F3). Because an operation of the second electronic component 205b entering and being mounted on the seating part 211 is similar to the above-described operation of assembling the first electronic component 205*a*, a more detailed description thereof will be omitted.

Figure 19:
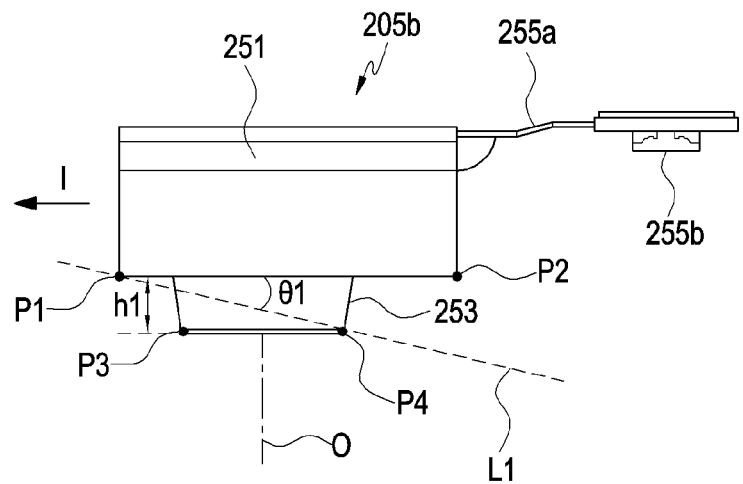
FIGS. 19 and 20 are views illustrating a design of a guide member of an electronic device according to various embodiments of the disclosure.
Figure 20:
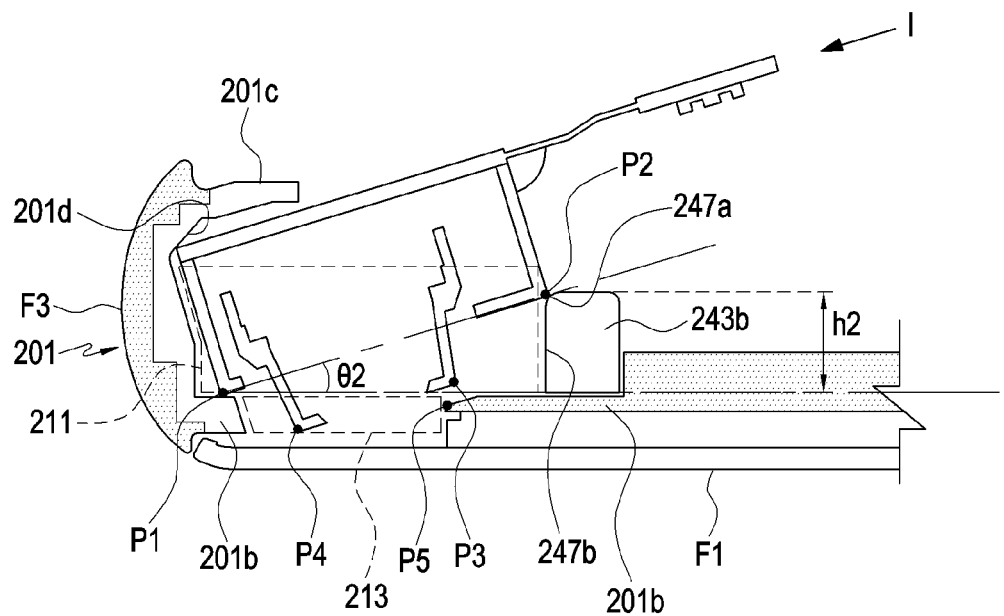

FIGS. 19 and 20 are views illustrating a design of a guide member 204 of an electronic device according to various embodiments of the disclosure.

As discussed above, the electronic device according to various embodiments of the disclosure may set an entrance direction (e.g., the inclination direction) of the electronic component by using the guide member when the electronic component is mounted on the housing. In the assembling process, the guide member can facilitate assembling of the electronic component while reducing an avoidance space for preventing interference between the electronic component (e.g., the second electronic component 205*b* and/or the protrusion 253 thereof in FIG. 18) and another structure. When the electronic component includes a protrusion such as a lens barrel, the guide member may provide an entrance path for the protrusion while guiding a path along which the protrusion enters the seating part. If a space (e.g., the through-hole 113*a* of FIG. 12), in which the electronic component is held, is provided on the seating part, the electronic component rotates in the seating part in a state in which the protrusion is partially located in the corresponding space, and the remaining portions of the protrusion may enter the corresponding space to be disposed in the corresponding space.

Referring to FIGS. 19 and 20, the above-described structure of the guide member will be described in more detail.

Referring to FIGS. 19 and 20, the second electronic component 205*b* may include a body part 251, a protrusion 253, a flexible printed circuit board 255*a*, and a connector 255*b*. The protrusion 253, for example, includes a plurality of lenses, and may be mounted on the body part 251 in the direction of the optical axis O to proceed and retreat. For example, the second electronic component 205*b* is a camera module and may be guided by the guide member 204 and enter (I) a space provided by the seating part 211 of the housing and the undercut structure.

According to various embodiments, while the second electronic component 205 enters (I) the seating part 211, one surface of the body part 251, for example, may slide-contact the guide member 204, for example, the second guide rib 243*b*. Because the second guide rib 243*b* extends from the first support piece 201*b* by a predetermined height, the second electronic component 205*b* and/or the body part 251 may enter (I) the seating part 211 along a direction that is inclined with respect to the first surface F1 of the housing 201 or the side wall F3 of the housing 201.

According to various embodiments, the front end portion P1 on one surface of the body part 251 contacts the first support piece 201*b* in a direction in which the second electronic component 205*b* enters (I) the seating part 211, the front end portion P4 of the protrusion 253 (e.g., the upper end of the protrusion 253) may be located in the through-hole 213 of the first support piece 201*b* when the rear end portion P2 on one surface of the body part 251 contacts the second guide rib 243*b* (e.g., the first mounting state of FIG. 15 and the like), and the rear end portion P3 of the protrusion 253 may be located in the seating part 211. For example, in the first mounting state, a portion of the protrusion 253 may be located in the through-hole 213, and another portion of the protrusion 253 may be located in the seating part 211.

According to various embodiments, the protrusion 253 may enter the seating part 211 without being interfered with by another structure until reaching the first mounting state. Referring to FIG. 19, an imaginary line L1 connecting the front end portion P1 on one surface of the body part 251 and the rear end portion P3 of the protrusion 253 may be inclined by an angle of θ1 with respect to one surface of the body part 251. In the first mounting state, one surface of the body part 251 may be inclined by an angle of θ2 with respect to the first support piece 201*b* or the first surface F1.

According to an embodiment, the angle of θ2 may be determined by a height h2 by which the second guide rib 243*b* extends from the first support piece 201*b*, and an interval between a location at which the front end portion P1 on one surface of the body part 251 contacts the first support piece 201*b* in the first mounting state to a location at which the second guide rib 243*b* is disposed. According to an embodiment, the height h2 may be a height of the second guide rib 243*b* itself. In another embodiment, the height h2 may include the thickness of the bonding member and the like for attaching the guide member 204 to the first support piece 201*b* and the height of the second guide rib 243*b* itself. In another embodiment, if another member that is different from the bonding member is interposed between the guide member 204 and the first support piece 201*b*, the height h2 may include the thickness of the other member that is different from the bonding member and the height of the second guide rib 243*b* itself. In some embodiments, the 'height h2' may mean a distance from the first plate (e.g., the inner surface (e.g., the inner side surface) of the first cover member 102 of FIG. 5) to the second surface or the third surface (e.g., the upper end surface of the second guide rib 243*b* or the upper end surface of the second shape portion 243*e*).

According to various embodiments, regardless of the height h2, the interval between the second guide rib 243*b* and the second support piece 201*c* may be sufficiently secured such that the body part 251 may enter the seating part 211, and the second guide rib 243*b* may be sufficiently spaced apart from another adjacent rib to provide a path along which the protrusion 253 may enter the seating part 211. In some embodiments, because the second electronic component 205*b* enters the seating part 211 while slide-contacting the second guide rib 243*b*, the entrance into the seating part 211 may be limited to an angular direction that is smaller than an angle of θ2.

In some embodiments, if the angle of θ2 (e.g., the angle of the inclination direction at which the second electronic component 205*b* enters (I)) is smaller than the angle of θ1, the rear end portion P3 of the protrusion 253 may be interfered with by the first support piece 201*b*, for example, a point (or a vicinity thereof) indicated by 'P5' in FIG. 20. According to various embodiments of the disclosure, as the angle of θ2 is set to be larger than the angle of θ1 (for example, the second guide rib 243*b* has a predetermined height), the protrusion 253 can be prevented from being interfered with by another structure. For example, when entering the seating part 211, the second electronic component 205*b* may be guided by the guide member 204 (e.g., the second guide rib 243*b*) and may enter along an inclination direction of an angle that is larger than the angle of θ2 with respect to the first surface F1. If the second electronic component 205*b* enters at an angle that is smaller than the angle of θ2 while being guided by the second rib 243*b*, the body part 251 may be interfered with by the second support piece 201*c* and may not be enter the seating part 211. For example, the second guide rib 243*b* may be configured such that the inclination angle at which the second electronic component 205*b* enters (I) is equal to or greater than the angle of θ2.

In an embodiment, the height h1 (e.g., the first distance H of FIG. 10) by which the protrusion 253 protrudes from one surface of the body part 251, for example, may be set to be smaller than the height h2 of the second guide rib 243*b*. For example, the height h2 of the second guide rib 243*b* may be set to be larger than the height h of the protrusion 253 (e.g., the height protruding from one surface of the body part 251), and the angle of θ2 may be set to be larger than the angle of θ1. The electronic device according to various embodiments of the disclosure can reduce an avoidance space for assembling the electronic component through setting of the height h2 of the second guide rib 243*b* or the inclination angle of the direction in which the electronic component enters (I). In some embodiments, in FIG. 20, the through-hole 213 may have a width that is large enough to hold the protrusion 253 (or allows a procession/retreatment of the protrusion 253) in the direction that is parallel to the first surface F1.

According to various embodiments, in the electronic device having the above-described structure (e.g., the inclination angle of the entrance (I) direction or the height h2 of the second guide rib 243*b*), if the second electronic component 205*b* reaches the first mounting state illustrated in FIG. 20, the front end portion P4 of the protrusion 253 may be located in the interior of the through-hole 213, and the rear end portion P3 of the protrusion 253 may be located in the seating part 211. If the second electronic component 205*b* rotates from the first mounting state, the rear end portion P2 on one surface of the body part 251 may approach the first support piece 201*b* (move downward in FIG. 20) while sequentially slide-contacting the curved guide part 247*a* and the linear guide part 247*b* of the second guide rib 243*b*. While the rear end portion P2 on one surface of the body part 251 approaches the first support piece 201*b*, the front end portion P1 on one surface of the body part 251 may move in a direction that approaches the inner surface of the side wall F3 (e.g., move to the left side in FIG. 20) while slide-contacting the first support piece 201*b*. For example, the second electronic component 205*b* rotates in the seating part 211, the rear end portion P3 of the protrusion 253 may gradually move along a linear or curved locus leftwards and downwards. Accordingly, in the first mounting state, if the second electronic component 205*b* rotates, the protrusion 253 may gradually move leftwards and downwards and enter the through-hole 213 while not being interfered with by another structure (e.g., a point indicated by 'p5' of the first support piece 201*b* or a vicinity thereof).

As described above, in coupling the electronic component to the housing, the electronic device according to various embodiments of the disclosure may guide the electronic component by using the guide member such that the electronic component enters in the inclination direction. If the electronic component includes a protrusion such as a lens barrel, the guide member provides a path along which the protrusion may enter the seating part of the electronic component to prevent the protrusion from being interfered with by another structure. The electronic component may rotate to be seated and disposed at a designed location and may enter and be disposed at a designed location (e.g., the interior of the through-hole of FIG. 20) while not being interfered with by another structure even though the protrusion does not have a separate avoidance space.

Figure 21:
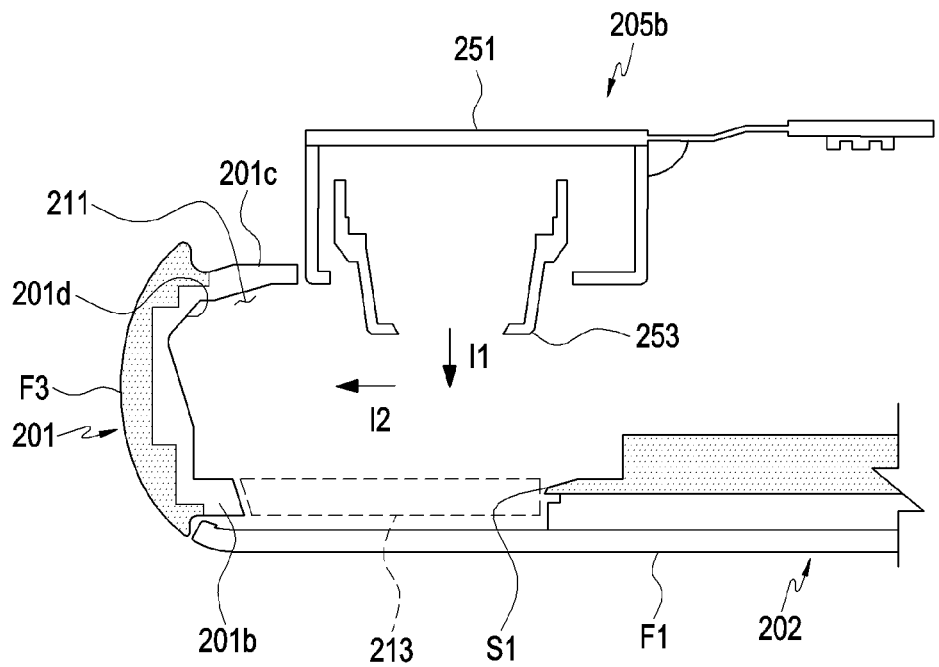
FIGS. 21 and 22 are views exemplifying an assembled state of an electronic component in a general electronic device.
Figure 22:
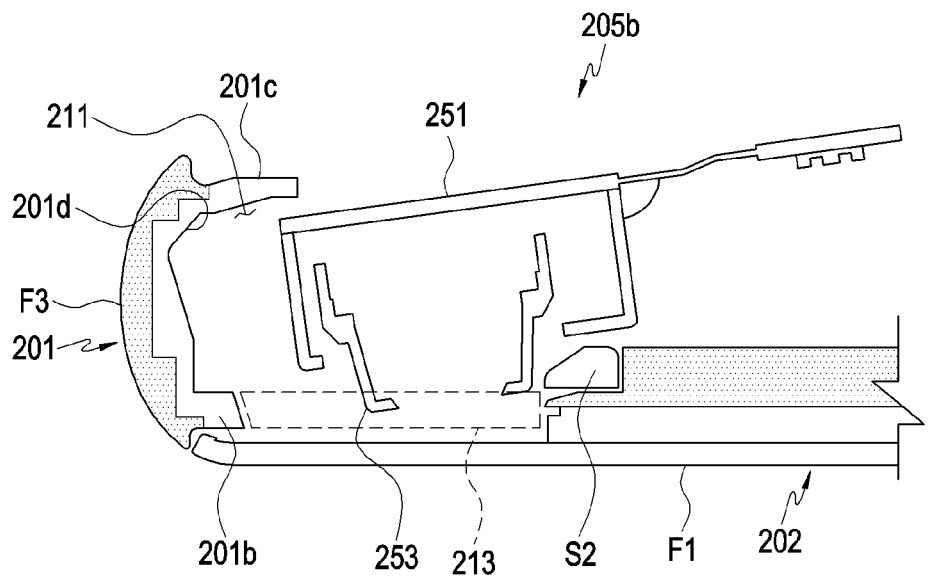

FIGS. 21 and 22 are views exemplifying an assembled state of an electronic component in a general electronic device.

Referring to FIG. 21, when the electronic component 205*b* is assembled in the seating part of the undercut structure at least partially surrounded by the second support piece 201*c*, the electronic component 205*b* may be seated in the undercut structure by causing the body part 251 to enter the seating part 211 in a direction in which the protrusion 253 approaches the first surface F1 first and then moving the body part 251 in a direction I2 that is parallel to the first surface F1. The assembly structure, in which the protrusion 253 enters in a direction that is perpendicular to the first surface F1 and moves in a direction that is parallel to the first surface F1 to be seated, may be easily assembled. However, in addition to the space for holding the protrusion 253 in a completely mounted state, a space in which the protrusion 253 may move without being interfered by another structure (e.g., a space in which the protrusion 253 may move while the electronic component 205*b* moves in a direction that is parallel to the first surface F1) can be secured. For example, the through-hole 213, in which the protrusion 253 is held, may be expanded to a point indicated by 'S1' (e.g., by a distance by which the protrusion 253 moves in a direction I2 that is parallel to the first surface F1), regardless of the actual size or shape of the protrusion 253. Because the movement space (or the avoidance space) is left as an empty space after the electronic component 205*b* is mounted, the utility efficiency of the interior space of the electronic device may be lowered.

Referring to FIG. 22, the electronic component 205*b* may enter the undercut structure to be inclined such that the protrusion 253 is not interfered with by another structure. However, when the entrance angle is not proper, the protrusion 253 may be interfered with by another structure and be damaged. In order to alleviate the damage, an impact absorbing member S2 and the like may be disposed, but the impact absorbing member S2 itself cannot prevent interference between the protrusion n253 and another structure. Accordingly, the defect rate of the assembly structure may be significantly changed according to the skill or fatigue of the operator.

According to various embodiments of the disclosure, as discussed through FIGS. 15 to 20, the guide member can prevent the protrusion, such as the lens barrel, from being interfered with by another structure by guiding the assembling direction of the electronic component mounted on the undercut structure. Further, because the electronic component is guided by the guide member enters the seating part and rotates (pivots) in the seating part to be assembled at a designed location, the guide member according to various embodiments of the disclosure may facilitate assembling while reducing the movement space or the avoidance space for the protrusion.

Figure 23:
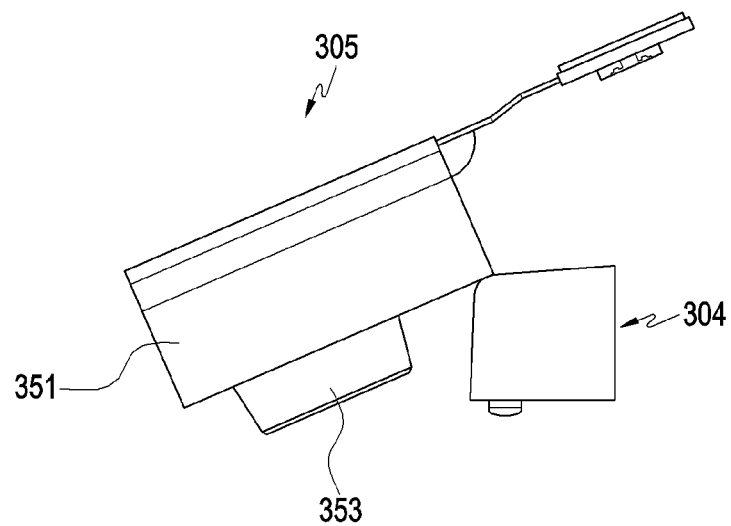
FIG. 23 is a side view illustrating another example of a guide member of an electronic device according to various embodiments of the disclosure.
Figure 24:
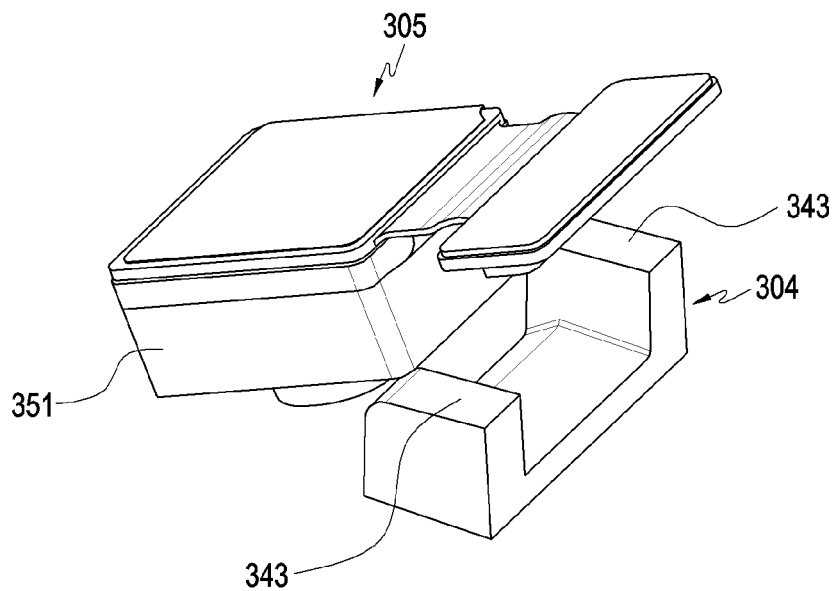
FIG. 24 is a perspective view illustrating another example of a guide member of an electronic device according to various embodiments of the disclosure.

FIG. 23 is a side view illustrating another example of a guide member 304 of an electronic device according to various embodiments of the disclosure. FIG. 24 is a perspective view illustrating another example of a guide member 304 of an electronic device according to various embodiments of the disclosure.

Referring to FIGS. 23 and 24, the electronic device according to various embodiments of the disclosure can guide assembling of one electronic component 305 by using one guide member 304. When assembling of one electronic component 305 is guided, the guide member 304 may include a pair of guide ribs 343. If the electronic component 305 includes a protrusion 353 disposed on one surface of the body part 351, the protrusion 353 may pass between the guide ribs 343 and enter the seating part (e.g., the seating part 111 of FIG. 13) disposed in the housing.

Figure 25:
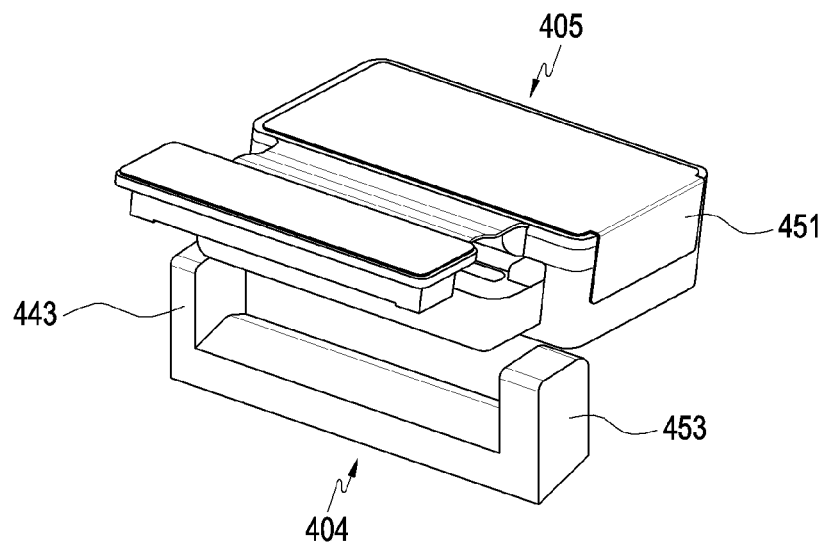
FIG. 25 is a perspective view illustrating another example of a guide member and an electronic component of an electronic device according to various embodiments of the disclosure.
Figure 26:
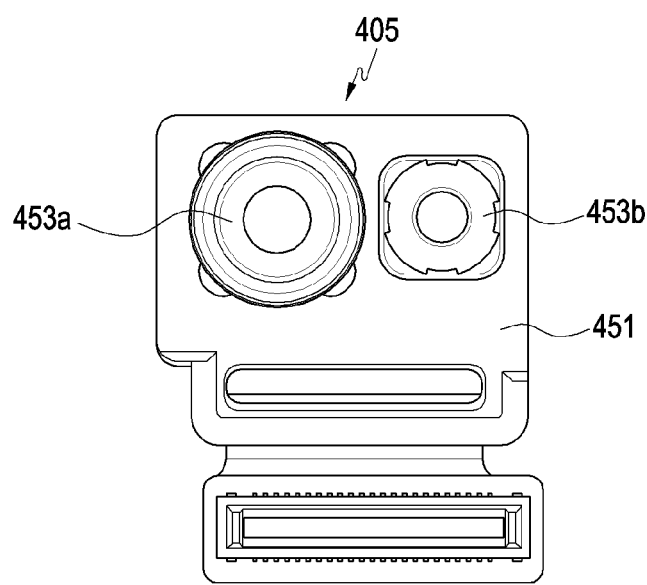
FIG. 26 is a plan view illustrating another example of a guide member and an electronic component of an electronic device according to various embodiments of the disclosure.

FIG. 25 is a perspective view illustrating another example of a guide member 404 and an electronic component 405 of an electronic device according to various embodiments of the disclosure. FIG. 26 is a plan view illustrating another example of a guide member 404 and an electronic component 405 of an electronic device according to various embodiments of the disclosure.

Referring to FIGS. 25 and 26, the electronic device according to various embodiments of the disclosure can guide assembling of one electronic component 404 by using one guide member 405. In some embodiments, the electronic component 405 may include one body part 451 and a plurality of protrusions 453a and 453b disposed in the body part 451. For example, the electronic component 405 may be a camera module including a plurality of image sensors and a plurality of lens barrels. In some embodiments, at least one of the protrusions 453a and 453b (e.g., the lens barrel) may perform an automatic focusing function while proceeding and retreating in the direction of the optical axis. When assembling of one electronic component 405 is guided, the guide member 404 may include a pair of guide ribs 443, and the protrusion(s) 453a and 453b may pass between the guide ribs 443 and enter the seating part (e.g., the seating part 111 of FIG. 13) disposed in the housing.

Figure 27:
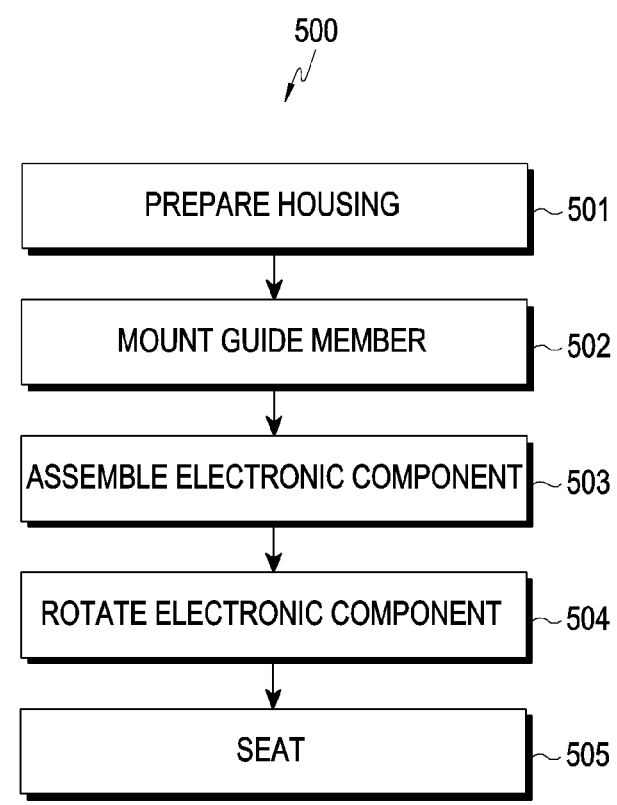
FIG. 27 is a flowchart illustrating a method for assembling an electronic device according to various embodiments of the disclosure.

FIG. 27 is a flowchart illustrating a method 500 for assembling an electronic device according to various embodiments of the disclosure.

Referring to FIG. 27, the method 500 may include an operation (hereinafter, 'operation 501') of preparing a housing (e.g., the housing 101 of FIG. 4), an operation (hereinafter, 'operation 502') of mounting a guide member (e.g., the guide member 104 of FIG. 4), an operation (hereinafter, 'operation 503') of assembling electronic components (e.g., the electronic components 105a and 105b of FIG. 4), an operation (hereinafter, 'operation 504') of rotating the electronic components (e.g., the electronic components 105a and 105b of FIG. 4), and a seating operation (hereinafter, 'operation 505').

According to various embodiments, operation 501 is an operation of manufacturing and preparing the housing, may include processes such as die casting, injection molding, and finishing, and may be different according to the material of the manufactured housing. In an embodiment, a secondary forming housing may be manufactured by manufacturing a primary forming housing by using a metallic material through die casting and additionally forming a synthetic resin material part partially in the primary forming housing through injection molding. The finishing operation may include an operation of manufacturing a housing having a shape that is suitable for an actual electronic device by partially cutting and removing the secondary forming housing. The finishing operation may further include a surface treating operation of wearing a surface of the housing or plating or coating the surface of the housing. In addition, the finishing operation may include other surface treating operations capable of giving various visual effects to the external shape.

According to various embodiments, operation 502 is an operation of mounting the separately manufactured guide member on the housing (the housing manufactured through operation 501), and the guide member may be attached to the housing by using a bonding member (and/or an adhesive). In some embodiments, the guide member may be mounted on the housing through fusion or welding or through an engaging structure, such as a screw or a hook.

According to various embodiments, operation 503 is an operation of causing the electronic component, which will be mounted on the housing, and for example, the body part of the electronic component may enter a seating part (e.g., the seating part 111 of FIG. 4) of the housing and/or a space formed to have the undercut structure. While entering the seating part, the electronic component may move along a direction that is inclined with respect to one surface of the housing while slide-contacting the guide member. The guide member may include guide ribs that slide-contact the body part of the electronic component, and if the electronic component includes a protrusion, the protrusion may enter the seating part between the guide ribs. If the electronic component sufficiently enters the seating part, a portion of the electronic component may be contacted and supported by a portion of the housing and the another portion may be contacted and supported by the guide member (e.g., the guide rib).

According to various embodiments, operation 504 is an operation of rotating the electronic component, which has entered the seating part, in the seating part, and another portion (e.g., a portion contacted and supported by the guide member) of the guide member may move in a direction in which the another portion of the guide member is adhered to the support piece of the housing and the like while slide-contacting the guide member when the electronic component rotates. As the electronic component rotates, the protrusion may enter a designed space (e.g., the through-hole 213 of FIG. 20) along a predetermined locus while pivoting or rotating in the seating part of the housing.

According to various embodiments, operation 505 is an operation of seating and disposing the electronic component at a designed in the seating part, and if the electronic component rotates in the seating part and any one surface of the electronic component is substantially adhered to a portion of the housing, the electronic component may be seated and disposed in the seating part. In some embodiments, in a state in which the electronic components are seated, a separate support member (e.g., the support member 103a of FIG. 4) may be coupled to the housing to prevent deviation of the seated electronic components.

According to various embodiments, an operation of separating the seated electronic component from the housing may be performed in the reverse order of the above-described method 500. For example, after the support member is separated first, the seated electronic component can be easily separated from the seating part in a state in which the electronic component rotates by a predetermined angle or more (rotates in the reverse direction of the assembling direction).

As described above, according to various embodiments of the disclosure, an electronic device may include:

a housing including a first face facing a first direction, a second face facing a second direction that is opposite to the first direction, and a side wall at least partially surrounding a space between the first face and the second face;

at least one seating part disposed such that at least a portion thereof is surrounded by a portion of the side wall in the interior of the housing;

a guide member disposed to be adjacent to a portion of the side wall in the interior of the housing and surrounding another portion of the seating part; and at least one electronic component including a body part and a protrusion disposed on one surface of the body part, wherein the electronic component may be guided by the guide member and enter the seating part along a direction that is inclined with respect to the side wall or the first surface and is mounted on the seating part.

According to various embodiments, the electronic component may include at least one of a camera module, an iris recognition sensor, a receiver, a proximity sensor, and an illumination sensor.

According to various embodiments, the guide member may include:

a fixing portion mounted on the housing; and a plurality of guide ribs extending from one surface of the fixing portion, wherein the guide ribs may face a portion of the side wall, and may be disposed to be spaced apart from the side wall at a predetermined interval, According to various embodiments, the body part may enter the seating part while slide-contacting the guide ribs, and the protrusion may enter the seating part between the guide ribs.

According to various embodiments, the electronic device may include:

at least one engaging hole disposed in the housing; and at least one fastening boss disposed on an opposite surface of the fixing portion, wherein the engaging boss may be engaged with the engaging hole to configure a mounting location of the fixing part.

According to various embodiments, the electronic device may further include a bonding member that attaches and fixes the fixing part to the housing.

According to various embodiments, n electronic components may be guided by the guide member and may enter and be mounted on the seating part, the guide member may include (n+1) guide ribs, and some of the guide members may be disposed between adjacent electronic components to interrupt electromagnetic interference between the electronic components.

(Here, 'n' is a natural number).

According to various embodiments, the housing may include:

a first support piece located to be close to the first surface and extending from the side wall;

a second support piece located to be close to the second surface and extending from the side wall; and an avoidance recess disposed on an inner surface of the side wall, between the first support piece and the second support piece, a portion of the body part may be located in the avoidance recess in a state in which the electronic component enters the seating part to be inclined, and the electronic component may rotate to be mounted on the seating part, in the seating part.

According to various embodiments, the electronic device may include:

a first cover member mounted on the first support piece to define the first surface; and a second cover member mounted on the second support piece to define the second surface.

According to various embodiments, when viewed from the top of the first surface, the first support piece may define a closed curve, and when viewed from the top of the second surface, the second support piece may define a closed curve, and the first support piece seals the housing and the first cover member, and the second support piece seals the housing and the second cover member.

According to various embodiments, the first cover member may include:

a window member mounted on the first support piece; and a display panel mounted on the inner surface of the window member.

According to various embodiments, the electronic device may further include a through-hole disposed in the first support piece, the protrusion may be a lens barrel that proceeds and retreats in an optical axis direction on the body part, and the protrusion may be disposed in the through-hole as the electronic component rotates.

According to various embodiments, the electronic device may further include a through-hole disposed in the first support piece, the guide member may include guide ribs mounted on the first support piece on one side of the through-hole and extending to face the side wall, and the protrusion may be at least partially held in the through-hole as the electronic component rotates in a state in which the electronic component enters the seating part.

According to various embodiments, the guide rib may include a curved guide part disposed at an upper end thereof, and a linear guide part extending from the curved guide part toward the first support piece, a front end portion on one surface of the body part may contact the first support piece in an entrance direction, and a rear end portion on one surface of the body part may contact the curved guide part (hereinafter, 'a first mounting state') as the electronic component enters the seating part, and as the electronic component rotates in the seating part from the first mounting state, the body part may be mounted in the interior of the seating part while a rear end portion on one surface of the body part sequentially slide-contacts the curved guide part and the linear guide part, and the protrusion may be held in the through-hole.

According to various embodiments, a front end portion of an upper end surface of the protrusion may be held in the through-hole in the first mounting state, and as the electronic component rotates in the seating part, the rear end portion on the upper end surface of the protrusion may enter the through-hole.

According to various embodiments, the first support piece, the second support piece, or the avoidance recess may surround a portion of the seating part or may define a portion of the seating part.

An electronic device according to various embodiments of the disclosure may include:

a housing including a first plate facing a first direction, a second plate facing a second direction that is opposite to the first direction, and a side member surrounding a space between the first plate and the second plate;

an inner surface disposed in the first plate and facing the second direction;

an inner flange disposed at a portion of the side member, disposed to be spaced apart from the inner surface, and protruding to the space along a third direction that is perpendicular to the first direction;

a touchscreen display exposed through a first portion of the first plate;

a camera module exposed through a second portion of the first plate, wherein the second portion is located between the first portion and the portion of the side member when viewed from the top of the first plate, wherein the camera module may include:

a substrate disposed between the second portion and the second plate;

a plurality of lenses stacked toward the second portion;

a barrel holding the plurality of lenses while having a first diameter; and a holder provided to surround the barrel while being connected to the substrate, and including a first surface facing the inner surface, wherein the barrel may move with respect to the holder, and a portion of the barrel may protrude from the first surface by a first distance, wherein a portion of the camera module may be interposed between the inner flange and the second portion;

a wireless communication circuit disposed in the housing;

a processor disposed in the housing, and electrically connected to the touchscreen display, the camera module, and the wireless communication circuit; and a first structure disposed in the housing at a location that is spaced apart from the portion of the side member by a second distance, wherein the holder of the camera module may be interposed between the portion of the side member and the first structure, wherein the first structure may include a second surface facing the second direction, and a third surface, wherein the second surface and the third surface may be aligned along the portion of the side member and may be spaced apart from the portion of the side member by a third distance that is larger than the first diameter, and wherein a fourth distance from the inner surface to the second surface or from the inner surface to the third surface may be set to be larger than the first distance.

According to various embodiments, the first structure may include:

a fixing portion mounted on the housing; and a plurality of guide ribs extending from one surface of the fixing portion, wherein the guide ribs may face the portion of the side member, and may be spaced apart from the portion of the side member by the second distance.

According to various embodiments, the second surface or the third surface may include one of upper surfaces of the guide ribs.

According to various embodiments, the first structure may be at least partially manufactured of a metallic material to provide an electromagnetic shielding function.

While the disclosure has been shown and described with reference to certain embodiments thereof, it will be understood by those skilled in the art that various changes in form and details may be made therein without departing from the spirit and scope of the disclosure as defined by the appended claims.

The invention claimed is:

1. An electronic device comprising:
    a housing comprising a first surface facing a first direction, a second surface facing a second direction that is opposite to the first direction, a side wall at least partially surrounding a space between the first surface and the second surface, and an undercut structure disposed on an inner surface of the side wall;
    a touchscreen display exposed through a first portion of the first surface;
    at least one seating part disposed such that at least a portion thereof is surrounded by a portion of the side wall in an interior of the housing;
    a guide member disposed to be adjacent to a portion of the side wall in the interior of the housing and surrounding another portion of the seating part; and
    at least one electronic component comprising a body part and a protrusion disposed on one surface of the body part,
    wherein the electronic component is exposed through a second portion of the first surface, wherein the second portion is located between the first portion and the portion of the side wall when viewed from a top of the first surface,
    wherein the inner surface of the side wall is disposed at an edge of one side of the seating part and the guide member is disposed at another edge of the opposite side of the seating part, and
    wherein a surface edge of the guide member is configured to slidably contact and guide the electronic component to enter the undercut structure along a third direction that is not vertical but inclined with respect to the first surface to enable the electronic component to be mounted on the seating part.

2. The electronic device of claim 1, wherein the electronic component comprises at least one of a camera module, an iris recognition sensor, a receiver, a proximity sensor, and an illumination sensor.

3. The electronic device of claim 1, wherein the guide member comprises:
    a fixing portion mounted on the housing; and
    a plurality of guide ribs extending from one surface of the fixing portion,
    the guide ribs face a portion of the side wall, and are disposed to be spaced apart from the side wall at a predetermined interval,
    the body part enters the seating part while slide-contacting the guide ribs, and
    the protrusion enters the seating part between the guide ribs.

4. The electronic device of claim 3, further comprising:
    at least one engaging hole disposed in the housing; and
    at least one engaging boss disposed on an opposite surface of the fixing portion,
    wherein the engaging boss is engaged with the engaging hole to set a mounting location of the fixing portion.

5. The electronic device of claim 3, wherein n electronic components are guided by the guide member to enter the seating part and be mounted on the seating part,
    the guide member comprises n+1 guide ribs, and
    some of the guide ribs are disposed between adjacent electronic components to block electromagnetic interferences between the electronic components, wherein 'n' is a natural number.

6. The electronic device of claim 1, wherein the housing comprises:
    a first support piece extending from the side wall;
    a second support piece extending from the side wall, the second support piece is located to be closer to the second surface than the first support piece and is located to be farther from the first surface than the first support piece; and
    an avoidance recess disposed on the inner surface of the side wall, between the first support piece and the second support piece,
    a portion of the body part is located in the avoidance recess in a state in which the electronic component enters the seating part to be inclined, and
    the electronic component is rotated in the seating part to be mounted on the seating part.

7. The electronic device of claim 6, further comprising:
    a first cover member mounted on the first support piece to define the first surface; and
    a second cover member mounted on the second support piece to define the second surface, wherein the first support piece defines a closed curve when viewed on the first surface, and the second support piece defines a closed curve when viewed on the second surface, and the first support piece seals the housing and the first cover member, and the second support piece seals the housing and the second cover member.

8. The electronic device of claim 6, further comprising:
a through-hole disposed in the first support piece,
wherein the protrusion is a lens barrel that proceeds and retreats in an optical axis direction on the body part, and
the protrusion is disposed in the through-hole as the electronic component rotates.

9. The electronic device of claim 6, further comprising:
a through-hole disposed in the first support piece,
wherein the guide member comprises guide ribs mounted on the first support piece on one side of the through-hole and extending to face the side wall, and
the protrusion is at least partially held in the through-hole in a state in which the electronic component enters the seating part and rotates.

10. The electronic device of claim 9, wherein a guide rib comprises:
a curved guide part disposed at an upper end thereof; and
a linear guide part extending from the curved guide part toward the first support piece,
a front end portion on one surface of the body part contacts the first support piece in an entrance direction, and a rear end portion on one surface of the body part contacts the curved guide part in a first mounting state as the electronic component enters the seating part,
the rear end portion of the one surface of the body part is mounted in the interior of the seating part while sequentially slide-contacting the curved guide part and the linear guide part, and the protrusion is held in the through-hole as the electronic component rotates in the seating part from the first mounting state,
a front end portion of an upper end surface of the protrusion is held in the through-hole in the first mounting state, and
a rear end portion of the upper end surface of the protrusion gradually enters the through-hole as the electronic component rotates in the seating part.

11. The electronic device of claim 6, wherein the first support piece, the second support piece, and the avoidance recess surround portions of the seating part, respectively, or define portions of the seating part.

12. An electronic device comprising:
a housing comprising a first plate facing a first direction, a second plate facing a second direction that is opposite to the first direction, and a side member surrounding a space between the first plate and the second plate;
an inner surface disposed in the first plate and facing the second direction;
an inner flange disposed at a portion of the side member, disposed to be spaced apart from the inner surface, and protruding to the space along a third direction that is perpendicular to the first direction;
a touchscreen display exposed through a first portion of the first plate;
a camera module exposed through a second portion of the first plate, wherein the second portion is located between the first portion and the portion of the side member when viewed from a top of the first plate,
wherein the camera module comprises:
a substrate disposed between the second portion and the second plate;
a plurality of lenses stacked toward the second portion;
a barrel holding the plurality of lenses while having a first diameter; and
a holder provided to surround the barrel while being connected to the substrate, and comprising a first surface facing the inner surface,
wherein the barrel moves with respect to the holder, and a portion of the barrel protrudes from the first surface by a first distance, and
wherein a portion of the camera module is interposed between the inner flange and the second portion;
a wireless communication circuit disposed in the housing;
a processor disposed in the housing, and electrically connected to the touchscreen display, the camera module, and the wireless communication circuit; and
a first structure disposed in the housing at a location that is spaced apart from the portion of the side member by a second distance,
wherein the holder of the camera module is interposed between the portion of the side member and the first structure,
the first structure comprises a second surface facing the second direction, and a third surface,
the second surface and the third surface are aligned along the portion of the side member and are spaced apart from each other by a third distance that is larger than the first diameter, and
a fourth distance from the inner surface to the second surface or from the inner surface to the third surface is set to be larger than the first distance.

13. The electronic device of claim 12, wherein the first structure comprises:
a fixing portion mounted on the housing; and
a plurality of guide ribs extending from one surface of the fixing portion, and
the guide ribs face the portion of the side member, and are spaced apart from the portion of the side member by the second distance.

14. The electronic device of claim 13, wherein the second surface or the third surface comprises one of upper surfaces of the guide ribs.

15. The electronic device of claim 12, wherein the first structure is at least partially manufactured of a metallic material to provide an electromagnetic shielding function.

* * * * *